(12) United States Patent
Matsudera

(10) Patent No.: US 7,808,269 B2
(45) Date of Patent: Oct. 5, 2010

(54) SEMICONDUCTOR INTEGRATED CIRCUIT

(75) Inventor: Katsuki Matsudera, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 9 days.

(21) Appl. No.: 12/146,804

(22) Filed: Jun. 26, 2008

(65) Prior Publication Data

US 2009/0039913 A1 Feb. 12, 2009

(30) Foreign Application Priority Data

Jun. 29, 2007 (JP) ............................. 2007-173180

(51) Int. Cl.
*H03K 17/16* (2006.01)
*H03K 19/003* (2006.01)

(52) U.S. Cl. .............................. 326/30; 326/86; 326/115

(58) Field of Classification Search .................... 326/30, 326/82–83, 86, 112, 115
See application file for complete search history.

(56) References Cited

U.S. PATENT DOCUMENTS

| | | | |
|---|---|---|---|
| 5,977,796 A * | 11/1999 | Gabara ......................... | 326/86 |
| 6,316,964 B1 * | 11/2001 | Watarai ....................... | 326/115 |
| 6,590,432 B1 * | 7/2003 | Wu et al. ..................... | 327/108 |
| 6,836,149 B2 * | 12/2004 | Chow .......................... | 326/83 |
| 6,847,232 B2 * | 1/2005 | Tinsley et al. ................ | 326/84 |
| 6,867,618 B2 * | 3/2005 | Li et al. ....................... | 326/83 |
| 6,900,663 B1 * | 5/2005 | Roper et al. .................. | 326/83 |
| 6,924,660 B2 | 8/2005 | Nguyen et al. | |
| 7,154,294 B2 * | 12/2006 | Liu et al. ...................... | 326/27 |
| 7,184,469 B2 * | 2/2007 | Joseph et al. ................. | 375/224 |
| 7,202,706 B1 * | 4/2007 | Plasterer et al. ............. | 326/127 |
| 7,215,147 B1 * | 5/2007 | Segervall ...................... | 326/83 |
| 7,279,937 B2 * | 10/2007 | Aliahmad et al. ........... | 326/115 |
| 7,301,366 B1 * | 11/2007 | Devnath et al. ............... | 326/30 |
| 7,304,506 B2 * | 12/2007 | Hangaishi .................... | 326/87 |
| 7,307,458 B1 * | 12/2007 | Segervall et al. ............ | 327/108 |
| 7,397,283 B2 * | 7/2008 | Chiu et al. .................... | 326/83 |
| 7,446,576 B2 * | 11/2008 | Fiedler ......................... | 327/108 |
| 7,514,968 B1 * | 4/2009 | Lai et al. ...................... | 327/108 |
| 7,573,299 B2 * | 8/2009 | Watarai ........................ | 326/83 |
| 2004/0041593 A1 * | 3/2004 | Lai ............................... | 326/115 |
| 2004/0246026 A1 * | 12/2004 | Wang et al. ................... | 326/86 |
| 2005/0285629 A1 * | 12/2005 | Hein et al. .................... | 326/115 |
| 2006/0132179 A1 * | 6/2006 | Kim .............................. | 326/82 |

* cited by examiner

*Primary Examiner*—James H. Cho
*Assistant Examiner*—Jason Crawford
(74) *Attorney, Agent, or Firm*—Turocy & Watson, LLP

(57) ABSTRACT

A semiconductor integrated circuit includes a control signal generating circuit which is configured to set, at least at a time of a first state, first and fifth control signals at a first voltage level, and second, third and fourth control signals at a second voltage level, and to set, at a time of a second state, the first to fourth control signals at the first voltage level, and the fifth control signal at an arbitrary voltage level.

7 Claims, 19 Drawing Sheets

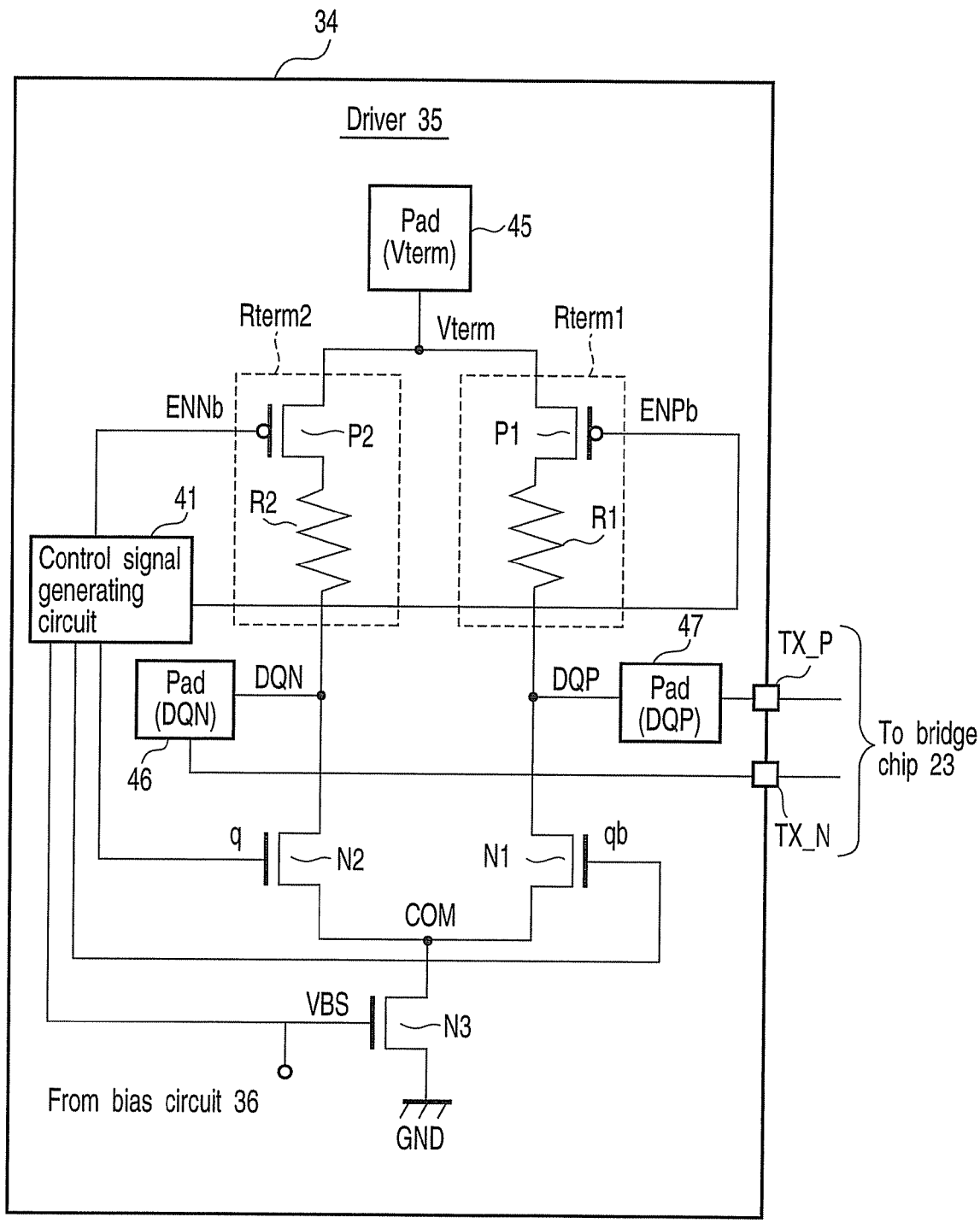
F I G. 3

| | Control signals | | | | |
|---|---|---|---|---|---|
| | (First control signal) ENPb | (Second control signal) ENNb | (Fourth control signal) q | (Third control signal) qb | (Fifth control signal) VBS |
| Normal operation | L | L | H/L | L/H | H |
| Hi-Z time | H | H | L | L | - |
| DQP side measurement — VA measurement time (ST1-2) | L | L | L | L | - |
| DQP side measurement — VB measurement time (ST1-1) | L | H | H | H | L |
| DQN side measurement — VA measurement time | H | L | L | L | - |
| DQN side measurement — VB measurement time | H | L | H | H | L |

F I G. 5

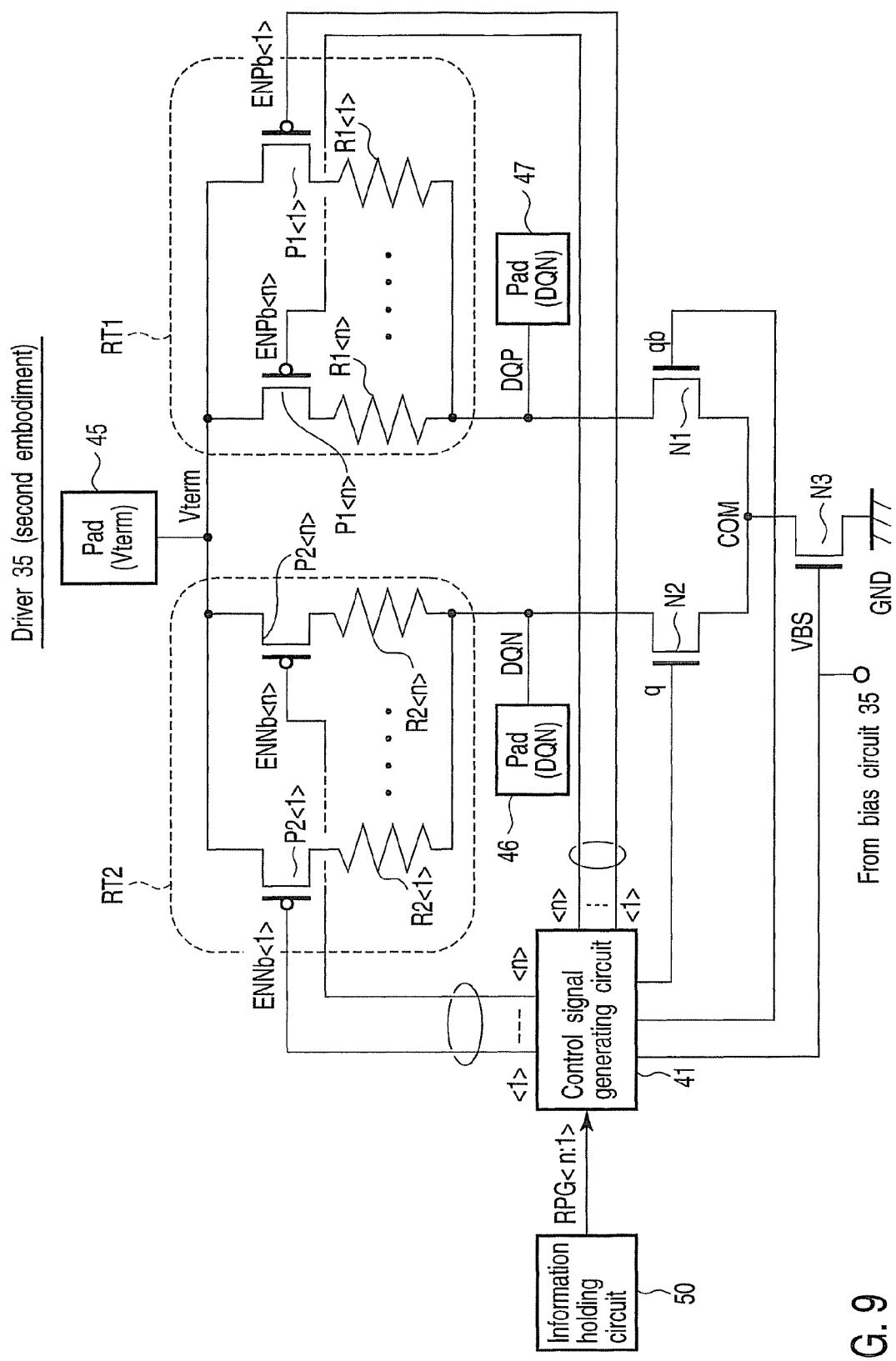
F I G. 9

|  |  | Control signals | | | | | |
|---|---|---|---|---|---|---|---|
|  |  | (Second control signal) EN | (First control signal) RENb1 | (Fourth control signal) RENb2 | (Third control signal) qb1 | (Fifth control signal) qb2 | (Sixth control signal) PRB |
|  | Normal operation | H | L | L | H/L | H/L | L |
|  | Hi-Z time | L | H | H | - | - | L |
| IO1 side measurement | VA measurement time (ST2-2) | L | L | L | - | - | L |
| | VB measurement time (ST2-1) | L | L | H | - | - | H |
| IO2 side measurement | VA measurement time | L | L | L | - | - | L |
| | VB measurement time | L | H | L | - | - | H |

FIG. 12

Measurement operation (at time of ST2-2)

|  |  | Signals | | |
| --- | --- | --- | --- | --- |
|  |  | RENb1 | RENb2 | PRB |
| Normal operation | | L | L | L |
| Hi-Z time | | H | H | L |
| IO1 side measurement | VA measurement time (ST3-2) | L | L | L |
| | VB measurement time (ST3-1) | L | H | H |
| IO2 side measurement | VA measurement time | L | L | L |
| | VB measurement time | H | L | H |

FIG. 17

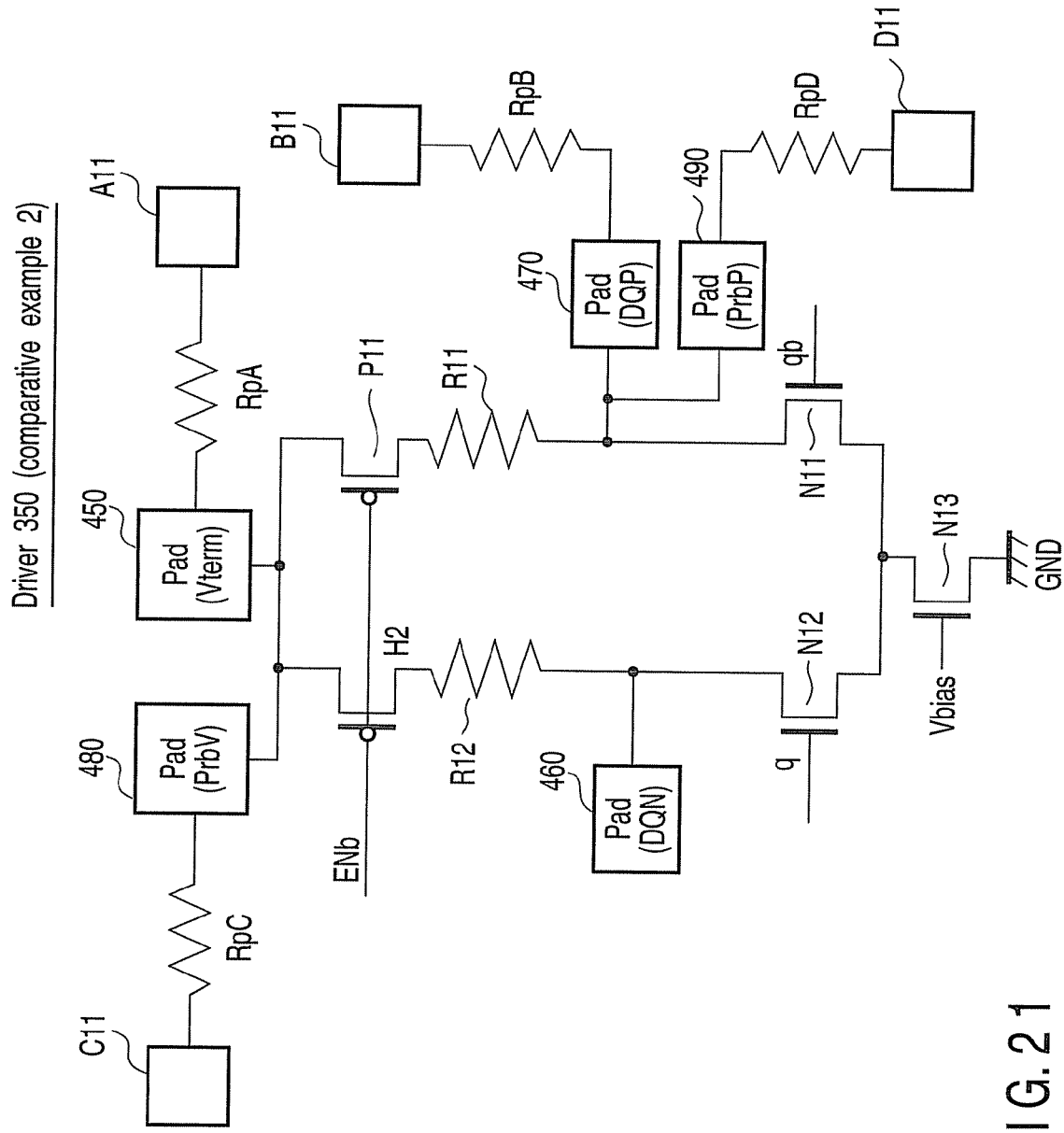
F I G. 21

SEMICONDUCTOR INTEGRATED CIRCUIT

CROSS-REFERENCE TO RELATED APPLICATIONS

This application is based upon and claims the benefit of priority from prior Japanese Patent Application No. 2007-173180, filed Jun. 29, 2007, the entire contents of which are incorporated herein by reference.

BACKGROUND OF THE INVENTION

1. Field of the Invention

The present invention relates to a semiconductor integrated circuit. For example, the invention is applied to an output driver circuit or an input receiver circuit, which includes a terminating resistor element.

2. Description of the Related Art

When high-speed data transfer is executed between semiconductor devices, there is a tendency that a problem arises due to reflection of a signal, which is caused by mismatching of impedance between transmission lines on a board (PCB) and input/output pins (or only input pins or only output pins) of semiconductor devices. In recent years, in semiconductor devices which execute high-speed data transfer, such a technique has widely been used that terminating resistor elements, which are formed of polysilicon, P-type or N-type doped silicon or transistors, are mounted at input/output pins (or only input pins or output pins) in semiconductor devices, thereby making impedance matching with characteristic impedance of transmission lines on the PCB.

In the above-described semiconductor device, in order to enhance impedance matching with transmission lines on the PCB, it is necessary to exactly measure and select the resistance value of the terminating resistor in the semiconductor device, and to set the resistance value at a target measurement value.

For this purpose, for example, as disclosed in U.S. Pat. No. 6,924,660, wide use has been made of a technique of measuring the terminal end resistance value during the operation of the system mounted on the PCB, and setting or correcting the resistance value. In this technique, however, there is a disadvantage, as an adverse effect, that the number of circuit elements increases and the device area increases. Furthermore, depending on purposes of use, there are such specifications that the measurement and setting of the terminal end resistance value during normal operation are impossible or difficult. Under the circumstances, in many cases, the measurement of the terminal end resistance is performed at the time of a wafer test in a semiconductor device fabrication process, or at the time of a product test after package sealing, and then the setting (correction) of the terminal end resistance value is performed.

Referring, for example, to the case of a differential output driver including a terminating resistor, the method of measuring the resistance value of the terminating resistor is explained. In this case, the resistance value of the terminating resistor is a series resistance of a P-type MOS transistor (P1) which is used for switching, and a resistor element (R1).

In this case, however, the measured resistance value of the terminating resistor necessarily becomes a value including an additional value of contact resistance between a jig of a tester and a pad. When the semiconductor device, which is sealed in the package, is mounted on the PCB, the respective terminals of the semiconductor device and the PCB are connected by soldering with a very low resistance value, and the contact resistance becomes a negligible value. However, at the time of the test, the contact value is present. In particular, at the time of the wafer test, stable contact at low resistance is difficult.

The above-described contact resistance is a non-negligible value for the terminal end resistance that is to be measured. Besides, the resistance value of this contact resistance varies from time to time in measurement, depending on various conditions such as contamination of the jig, the number of times of measurement, and the contact pressure between the terminal of the semiconductor device and the jig. It is thus impossible to remove such a variation as a fixed offset from the measured resistance value.

If pads for voltage measurement are added to the pads for terminal end power supply and for measurement in the differential output driver, it becomes possible to measure the terminal end resistance by eliminating the influence of the contact resistance.

However, this circuit configuration is not practical since it is necessary to additionally provide the pads for voltage measurement, and thus the area of occupation increases due to the increase of the pin capacitance of the output terminal and the increase of the device area.

BRIEF SUMMARY OF THE INVENTION

According to an aspect of the present invention, there is provided a semiconductor integrated circuit comprising: a first transistor of a first conductivity type, which has a current path with one end connected to a first power supply, and has a control terminal to which a first control signal is input; a second transistor of the first conductivity type, which has a current path with one end connected to the first power supply, and has a control terminal to which a second control signal is input; a first resistor element having one end connected to the other end of the current path of the first transistor, and having the other end connected to a first output terminal; a second resistor element having one end connected to the other end of the current path of the second transistor, and having the other end connected to a second output terminal; a third transistor of a second conductivity type, which has a current path with one end connected to the other end of the first resistor terminal, and has a control terminal to which a third control signal is input; a fourth transistor of the second conductivity type, which has a current path with one end connected to the other end of the second resistor terminal, and has a control terminal to which a fourth control signal is input; a fifth transistor of the second conductivity type, which has a current path with one end connected to the other end of the current path of the third transistor and to the other end of the current path of the fourth transistor, and with the other end connected to a second power supply, and has a control terminal to which a fifth control signal is input; and a control signal generating circuit which sets, at least at a time of a first state, the first and fifth control signals at a first voltage level, and the second, third and fourth control signals at a second voltage level, and sets, at a time of a second state, the first to fourth control signals at the first voltage level, and the fifth control signal at an arbitrary voltage level.

According to another aspect of the present invention, there is provided a semiconductor integrated circuit comprising: a first driver which includes a first resistor element having one end connected to a first external terminal, a first transistor of a first conductivity type which has a current path with one end connected to the other end of the first resistor element and with the other end connected to a power supply, and has a control terminal to which a first control signal is input, and a first buffer having an input to which a second control signal and a third control signal are input and having an output connected to the one end of the first resistor element; a second driver which includes a second resistor element having one end connected to a second external terminal, a second transistor of the first conductivity type which has a current path with one end connected to the other end of the second resistor element and with the other end connected to the power supply, and has a control terminal to which a fourth control signal is input, and a second buffer having an input to which the second control signal and a fifth control signal are input and having an output connected to the one end of the second resistor element; a third transistor which has a current path with one end connected to the first external terminal and with the other end connected to the second external terminal, and has a control terminal to which a sixth control signal is input; and a control signal generating circuit which sets, at least at a time of a first state, the first and second control signals at a first voltage level, the fourth and sixth control signals at a second voltage level, and the third and fifth control signals at an arbitrary voltage level, and sets, at a time of a second state, the first, second and fourth control signals at the first voltage level, the sixth control signal at the first voltage level, and the third and fifth control signals at an arbitrary voltage level.

According to still another aspect of the present invention, there is provided a semiconductor integrated circuit comprising: a first receiver which includes a first resistor element having one end connected to a first external terminal, a first transistor of a first conductivity type which has a current path with one end connected to the other end of the first resistor element and with the other end connected to a power supply, and has a control terminal to which a first control signal is input, and a first input receiver circuit having an input connected to the first external terminal; a second receiver which includes a second resistor element having one end connected to a second external terminal, a second transistor of the first conductivity type which has a current path with one end connected to the other end of the second resistor element and with the other end connected to the power supply, and has a control terminal to which a second control signal is input, and a second input receiver circuit having an input connected to the second external terminal; a third transistor which has a current path with one end connected to the first external terminal and with the other end connected to the second external terminal, and has a control terminal to which a third control signal is input; and a control signal generating circuit which sets, at least at a time of a first state, the first control signal at a first voltage level, and the second and third control signals at a second voltage level, and sets, at a time of a second state, the first, second and third control signals at the first voltage level.

BRIEF DESCRIPTION OF THE SEVERAL VIEWS OF THE DRAWING

FIG. 3 is a circuit diagram showing the semiconductor integrated circuit according to the first embodiment;

FIG. 5 is a view for explaining control signals of a control signal generating circuit according to the first embodiment;

FIG. 9 is a circuit diagram showing a semiconductor integrated circuit according to a second embodiment of the invention;

FIG. 12 is a view for explaining control signals of a control signal generating circuit according to the third embodiment;

FIG. 17 is a view for explaining control signals of a control signal generating circuit according to the fifth embodiment;

FIG. 21 is a circuit diagram showing a semiconductor integrated circuit according to comparative example 2.

DETAILED DESCRIPTION OF THE INVENTION

Figure 1:
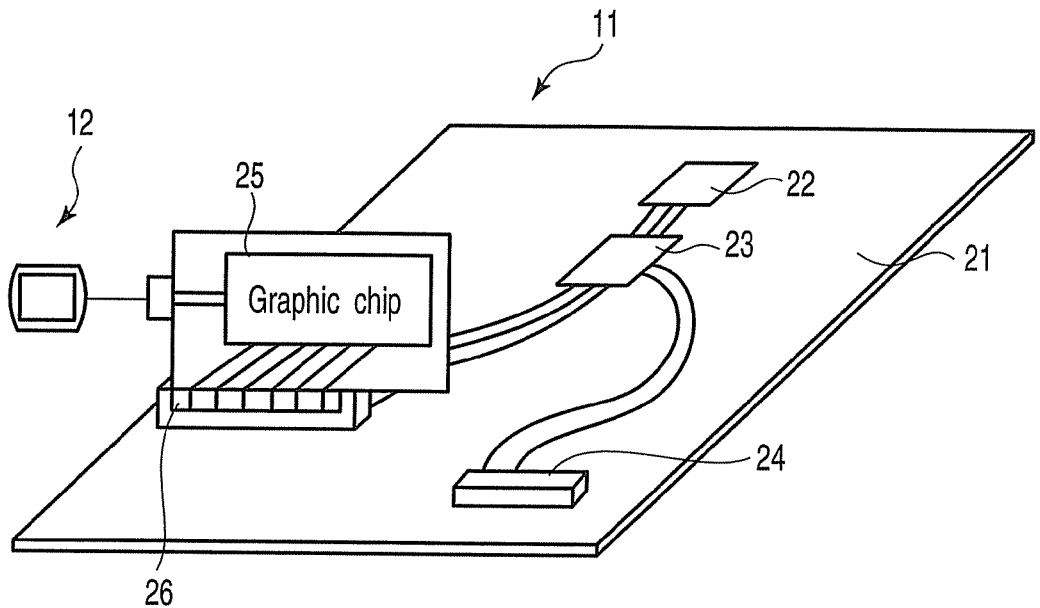
FIG. 1 is a system (display driving device) to which a semiconductor integrated circuit according to a first embodiment of the present invention is applied.

Embodiments of the present invention will now be described with reference to the accompanying drawings.

In the description below, common parts are denoted by like reference numerals throughout the drawings.

First Embodiment

1. Example of System

To begin with, referring to FIG. 1, a description is given of an example of a system including a semiconductor integrated circuit according to a first embodiment of the present invention. In the description of this embodiment, a display driving device is taken as an example of the system.

As shown in FIG. 1, a display driving device 11 for driving a display 12 is disposed. The display 12 displays video in accordance with an output signal of the display driving device 11.

The display driving device 11 includes a CPU 11, a bridge chip 23, a hard disk drive (HDD) 24 and a graphic chip 25, which are mounted on a motherboard 21.

The CPU 22 is configured to control the entirety of the display driving device 11. The bridge chip 23 is configured to selectively deliver an output signal from the hard disk drive 24 or an output signal from the graphic chip 25 to the CPU 22. The graphic chip 25 is configured to include a slot 26 and to output an I/O signal to the display 12.

2. Structure Example of Graphic Chip

Figure 2:
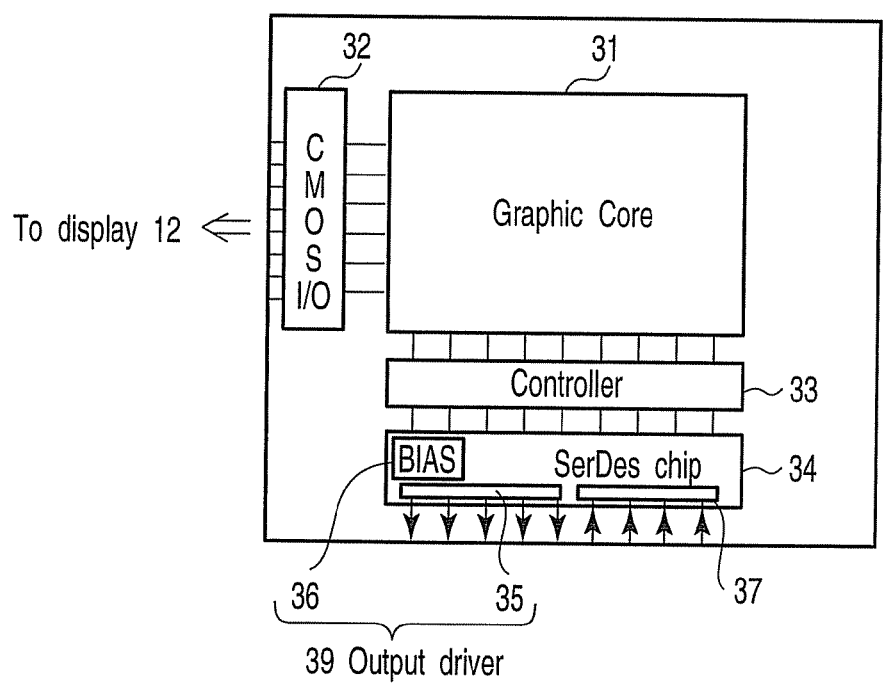
FIG. 2 is a block diagram showing a chip including the semiconductor integrated circuit according to the first embodiment.

Next, referring to FIG. 2, a structure example of the graphic chip is described. The graphic chip 25 according to this embodiment comprises a graphic core 31, a CMOS I/O 32, a controller 33 and a high-speed serializer/deserializer (SerDes) chip 34.

The graphic core 31 is configured to include a plurality of micro-lenses which are arranged in a matrix, and to output graphic signals from the micro-lenses to the CMOS I/O 32.

The CMOS I/O 32 is configured to include a CMOS circuit, to convert the graphic signals to I/O signals and to output the I/O signals to the display 12.

The controller 33 is configured to control the entirety of the graphic chip 25.

The high-speed serializer/deserializer (SerDes) chip 34 includes an output driver 39 and a receiver 37.

The receiver 37 is configured to receive input signals from the bridge chip 23.

The output driver 39 includes a driver 35 and a bias circuit 36. The driver 35 is configured to output predetermined driving voltages. The bias circuit 36 is configured to output bias signals VBS, which control the output of the driver 35, to the driver 35.

3. Structure Example of Differential Output Driver

Next, referring to FIG. 3, a structure example of a differential output driver according to the present embodiment is described. In the description of this embodiment, a CML differential amplifier having on-chip terminating resistors, which is a transmitter (TX) output driver of a physical layer (PHY), is taken as an example of the driver 35.

As shown in FIG. 3, the driver 35 according to the present embodiment includes PMOS transistors P1, P2, resistor elements R1, R2, NMOS transistors N1, N2, N3, and a control signal generating circuit 41.

The source of the PMOS transistor (first transistor) P1 is connected to a pad 45 to which a power supply Vterm is applied. The drain of the PMOS transistor P1 is connected to one end of the resistor element R1. A first control signal ENPb is input from the control signal generating circuit 41 to the gate of the PMOS transistor P1.

The source of the PMOS transistor (second transistor) P2 is connected to the pad 45 to which the power supply Vterm is applied. The drain of the PMOS transistor P2 is connected to one end of the resistor element R2. A second control signal ENNb is input from the control signal generating circuit 41 to the gate of the PMOS transistor P2.

The other end of the first resistor element R1 is connected to an output pad 47 which is connected to a positive output pin TX_P.

The other end of the second resistor element R2 is connected to an output pad 46 which is connected to a negative output pin TX_N.

The source of the NMOS transistor (third transistor) N1 is connected to the drain of the NMOS transistor N3. The drain of the NMOS transistor N1 is connected to the pad 47, and a third control signal qb is input to the gate of the NMOS transistor N1.

The source of the NMOS transistor (fourth transistor) N2 is connected to the drain of the NMOS transistor N3. The drain of the NMOS transistor N2 is connected to the pad 46, and a fourth control signal q is input to the gate of the NMOS transistor N2.

The source of the NMOS transistor (fifth transistor) N3 is connected to a ground power supply GND, and a fifth control signal VBS is input to the gate of the NMOS transistor N3.

The control signal generating circuit 41 is configured to generate the first to fifth control signals ENPb, ENNb, qb, q and VBS, which switch turn-on/off of the transistors P1, P2, N1, N2 and N3, at least at the time of executing a measurement method of the resistance value of the terminating resistor, as will be described later.

Specifically, at the time of step ST1-1 (first state), the control signal generating circuit 41 is configured to set the first and fifth control signals ENPb and VBS at "L" level and sets the second, third and fourth control signals ENNb, qb and q at "H" level. At the time of step ST1-2 (second state), the control signal generating circuit 41 is configured to set the first to fourth control signals ENPb, ENNb, qb and q at "L" level and sets the fifth control signal VBS at an arbitrary voltage level (No Care).

The node DQP is terminated at the power supply Vterm via a series resistor (Rterm1) which is composed of the transistor P1 and first resistor element R1. Similarly, the node DQN is terminated at the power supply Vterm via a series resistor (Rterm2) which is composed of the transistor P2 and second resistor element R2. A potential (vbias), which causes an output current Iout to flow, is input to the gate of the transistor N3.

4. Bias Operation

Figure 4:
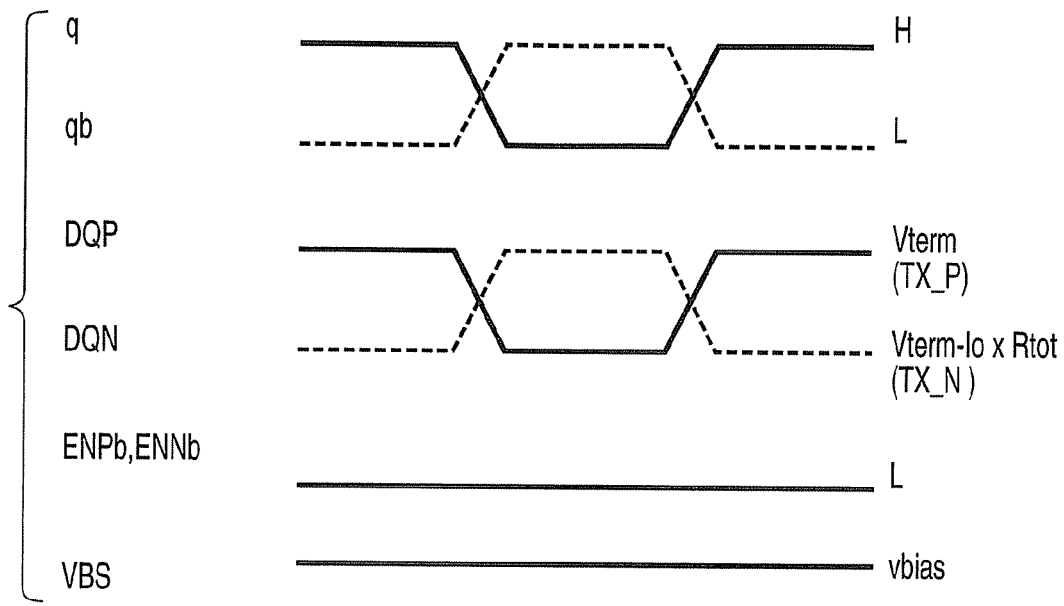
FIG. 4 shows operational waveforms of the semiconductor integrated circuit according to the first embodiment.

Next, referring to FIG. 4 and FIG. 5, the bias operation of the driver 35 of the present embodiment is described.

<At Time of Normal Operation>

As shown in FIG. 5, at the time of normal operation, an "L" level voltage is input as the first and second control signals ENPb and ENNb, an "L" or "H" level voltage is input as the third control signal qb, an "L" or "H" level voltage is input as the fourth control signal q, and an "H" level voltage (=Vbias level: analog potential for giving a desired amplitude to DQP/DQN) is input as the fifth control signal VBS.

Thus, when V(q)>V (qb), like operational waveforms of FIG. 4, a level of Vterm is output from the output pin TX_P which is connected to the node DQP, and a level of Vterm−Iout×Rtot2 is output from the output pin TX_N which is connected to the node DQN, so that differential amplification is performed by the third and fourth control signals qb and q which are gate inputs to the transistors N1 and N2. The resistance Rtot2 is a composite impedance of characteristic impedances of transmission lines which are connected to the second terminating resistor Rterm2 and the DQN pad 46.

On the other hand, when V(q)<V (qb), like operational waveforms of FIG. 4, a level of Vterm is output from the output pin TX_N which is connected to the node DQN, and a level of Vterm−Iout×Rtot1 is output from the output pin TX_P which is connected to the node DQP, so that differential amplification is performed by the third and fourth control signals qb and q which are gate inputs to the transistors N1 and N2. The resistance Rtot1 is a composite impedance of characteristic impedances of transmission lines which are connected to the first terminating resistor Rterm1 and the DQP pad 47.

However, when the potential difference between V(q) and V(qb) is small, or during transition, V(DQP) and V(DQN) take levels between V(Vterm) and V(Vterm)−Iout×Rtot1 (or Rtot2).

<At Time of High Impedance>

At a time of high impedance (Hi-Z time), an "H" level voltage is input as the first and second control signals ENPb and ENNb, a "L" level voltage is input as the third and fourth control signals qb and q, and a voltage of an arbitrary level is input as the fifth control signal VBS.

Accordingly, the transistors P1, P2, N1 and N2 are all turned off.

5. Measurement Method of Resistance Values of Terminating resistors

Next, referring to FIG. 5 to FIG. 8, a description is given of a measurement method of resistance values of the terminating resistors Rterm1 and Rterm2 of the semiconductor integrated circuit according to the present embodiment. In the description below, a case of measuring the first terminating resistor Rterm1, which is the series resistor of the transistor P1 and first resistor element R1, is described by way of example.

Figure 6:
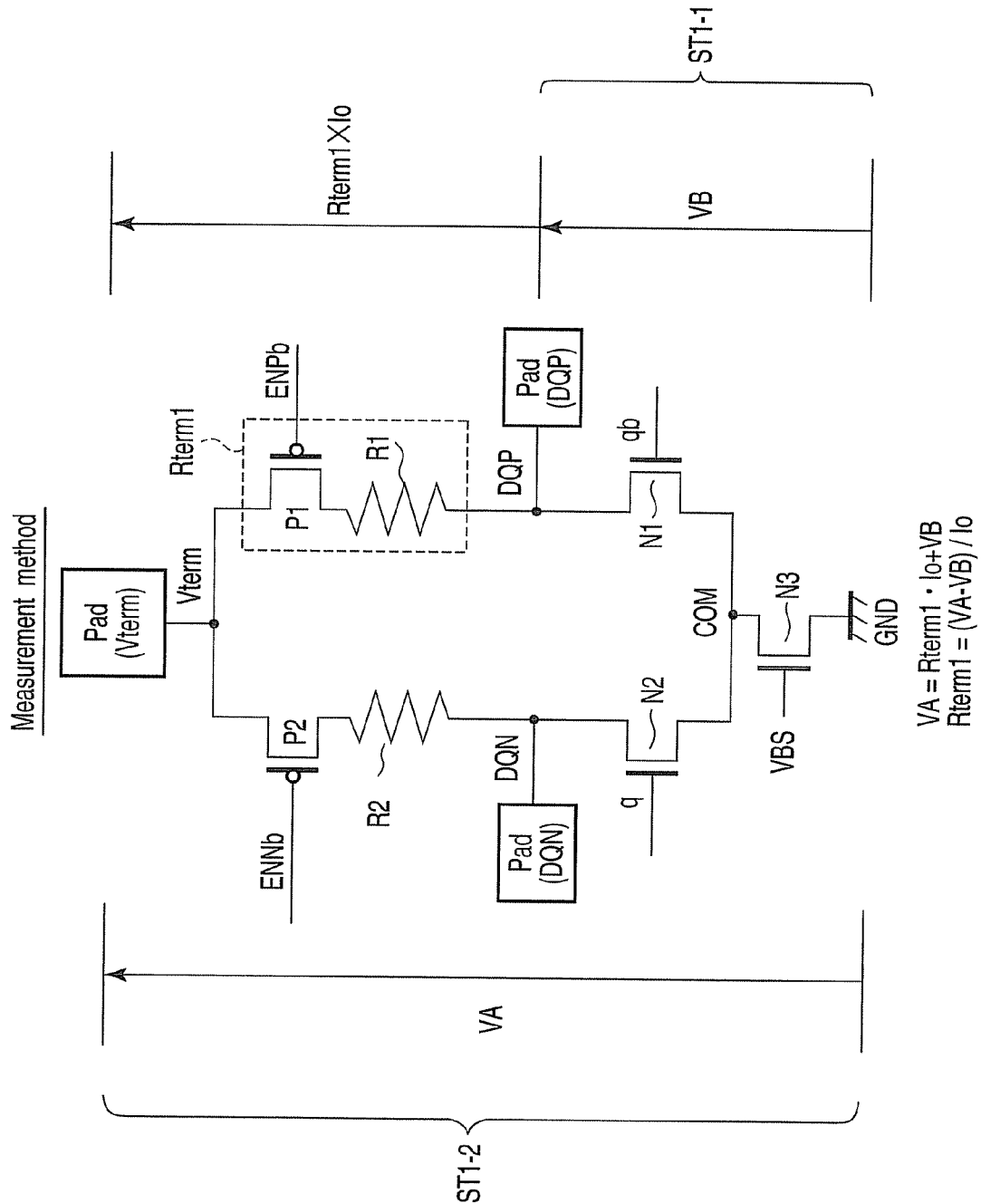
FIG. 6 is a circuit diagram for describing a measurement method of the semiconductor integrated circuit according to the first embodiment.

As shown in FIG. 6, in the case of the driver 35 of the present embodiment, the resistance value of the terminating resistor Rterm1 can exactly be measured by performing measurement twice, that is, step ST1-1 (measurement 1) and step ST1-2 (measurement 2), which will be described below. In step ST1-1 (measurement 1), a voltage VB is measured. Subsequently, in step ST1-2 (measurement 2), a voltage VA is measured. In this description, depiction of wiring of the control signal generating circuit 41 is omitted.

<5-1. Step ST1-1 (Measurement 1)>

Figure 7:
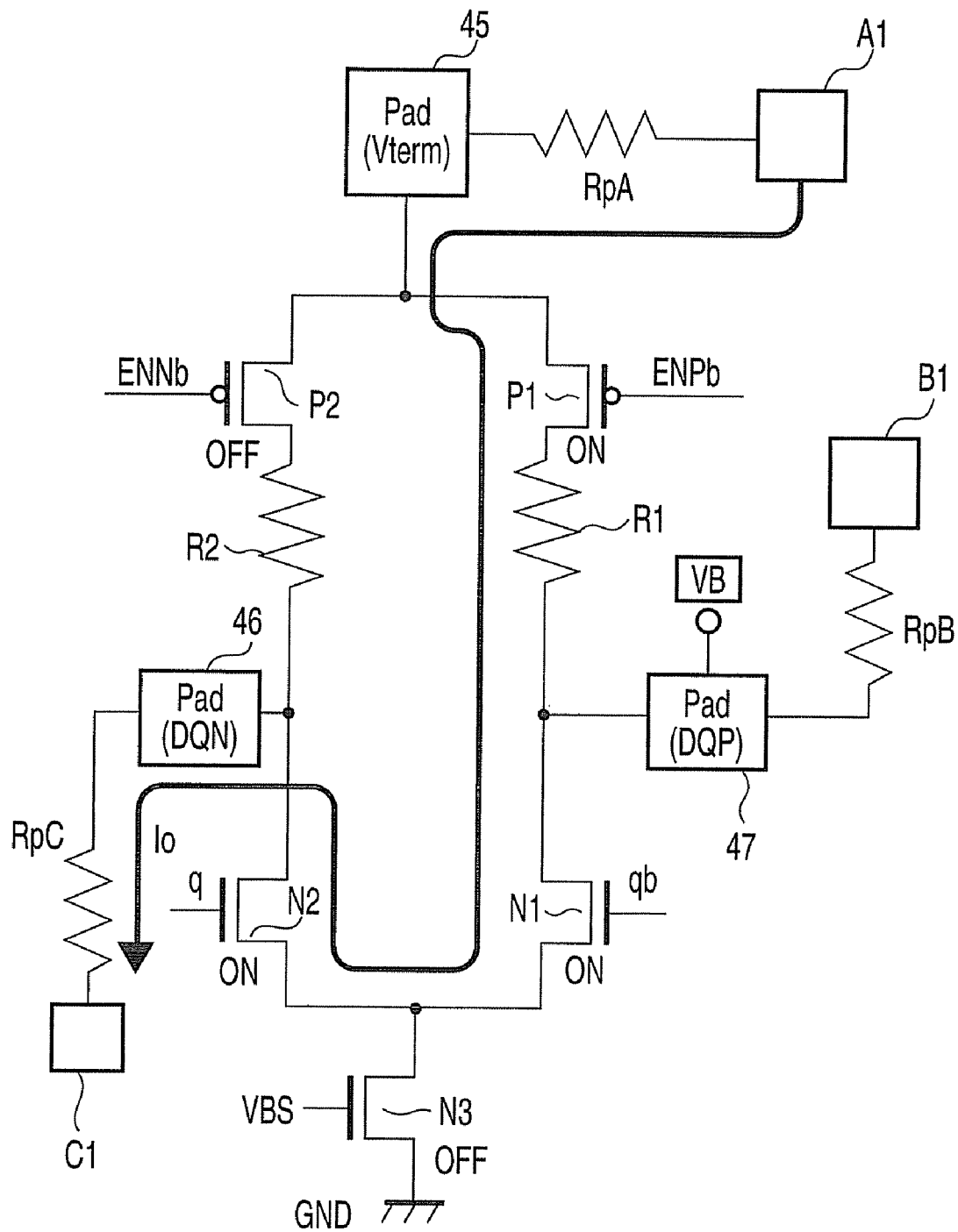
FIG. 7 is a circuit diagram for explaining a step of the measurement method of the semiconductor integrated circuit according to the first embodiment.

To begin with, referring to FIG. 7, measurement 1 is described. Step ST1-1 (measurement 1) is a step of measuring the voltage VB.

As shown in the Figures, the control signal generating circuit 41 sets the first and fifth control signals ENPb and VBS at "L" level and the second, third and fourth control signals ENNb, qb and q at "H" level, thereby to turn on the transistors P1, N1 and N2 and to turn off the transistors P2 and N3.

At this time, a tester terminal A1 is connected to the power supply Vterm pad 45, a tester terminal B1 is connected to the DQP pad 47, and a tester terminal C1 is connected to the DQN pad 46. In addition, a current Io is caused to flow between the tester terminal A1 and the tester terminal C1.

Since the transistors P2 and N3 are in the OFF state, an electric current flows only through a current path shown in FIG. 7, and the current Io flows through the transistor P1 and the first resistor element R1.

In this state, the voltage of the DQP pad 47 is measured at the tester terminal B1. This voltage is assumed to be VB. A contact resistance RpB is present between the tester terminal B1 and the DQP pad 47. However, since no current flows between the DQP pad 47 and tester terminal B1, the voltage VB of the DQP pad 47 can exactly be measured.

<5-2. Step ST1-2 (Measurement 2)>

Figure 8:
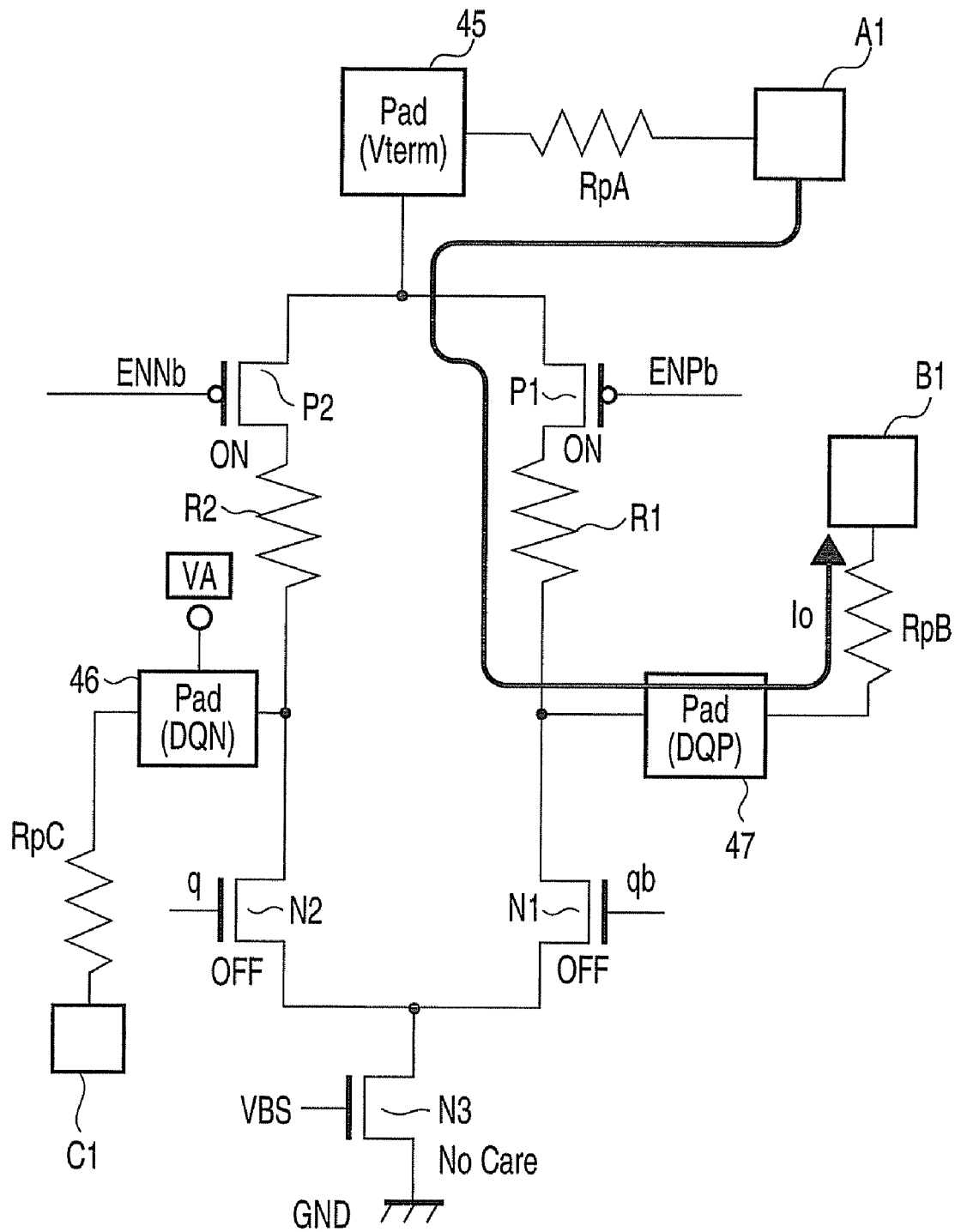
FIG. 8 is a circuit diagram for explaining a step of the measurement method of the semiconductor integrated circuit according to the first embodiment.

Referring to FIG. 8, measurement 2 is described. Step ST1-2 (measurement 2) is a step of measuring the voltage VA.

As shown in the Figures, the control signal generating circuit 41 sets the first to fourth control signals ENPb, ENNb, qb and q at "L" level.

A current Io (the same as the current that is caused to flow in measurement 1) is caused to flow between the tester terminal A1 and the tester terminal B1.

In this case, it is necessary to perform measurement 2 while keeping the contact state in measurement 1, so that the contact resistance RpA between the power supply Vterm pad 45 and the tester terminal A1 is equal between the measurement 1 and measurement 2.

In this state, since the transistors N1 and N2 are turned off, an electric current flows only through a current path shown in FIG. 8. The current Io flows through the transistor P1 and first resistor element R1. In this state, the voltage VA of the DQN pad 46 is measured at the tester terminal C1. The voltage in this state is assumed to be VA.

At this time, a contact resistance RpC is present between the tester terminal C1 and the DQN pad 46. However, since no current flows between the DQN pad 46 and tester terminal C1, the voltage of the DQN pad 46 can exactly be measured.

Further, needless to say, no electric current flows between the power supply terminal Vterm pad 45 and the DQN pad 46 at this time. Thus, the voltage of the DQN pad 46 in this state is equal to the potential of the power supply Vterm pad 45. By the measurement 2, it is possible, therefore, to exactly measure the voltage of the Vterm pad 45 at the time when the current Io flows through the transistor P1 and first resistor element R1.

<5-3. Calculation of Resistance Value Rterm1 of Terminating Resistors>

The resistance value Rterm1 of the terminating resistor (the series resistor of the transistor P1 and first resistor element R1) can be calculated by using the voltages VA and VB which are obtained by measurement 1 and measurement 2 in steps ST1-1 and ST1-2, and the current Io that is caused to flow.

Specifically, since a potential difference VA−VB is a potential difference at the Rterm 1 when the current Io flows, the resistance value of the terminating resistor is expressed by the following equation (1):

$$Rterm1 = (VA - VB)/Io \qquad (1)$$

As has been described in connection with the steps ST1-1 and ST1-2, the measured voltages VA and VB are exact values from which the influence of the contact resistances RpA, RpB and RpC is eliminated.

Further, as will be described later in connection with comparative examples, since the number of pads does not increase, an increase in area of occupation can be prevented.

When the terminal end resistance is measured, there is no need to connect devices, such as transistors, to the DQP pad 47 and DQN pad 46. For example, in the present embodiment, when the measurement is performed, it should suffice if the tester terminals B1 and C1 are connected to the DQP pad 47 and DQN pad 46. Thus, since the number of devices, such as transistors, which are connected to the DQP pad 47 and DQN pad 46, does not increase, there is no increase in parasitic capacitance which causes a problem in high-speed operations.

Needless to say, if the signal states (levels) of the control signals, as shown in FIG. 5, are reversed, the resistance value of Rterm2 (the series resistor of the transistor P2 and second resistor element R2), like Rterm1, can exactly be measured.

6. Advantageous Effects of the First Embodiment

At least the following advantageous effects (1) and (2) can be obtained by the semiconductor integrated circuit according to the present first embodiment.

(1) The resistance values of the terminating resistors can exactly be measured by eliminating the influence of contact resistance, and the increase in area of occupation can be prevented.

As has been described above, the driver 35 according to the present embodiment includes the control signal generating circuit 41. At least at the time of step ST1-1 (first state), the control signal generating circuit 41 is configured to set the first and fifth control signals ENPb and VBS at "L" level and sets the second, third and fourth control signals ENNb, qb and q at "H" level. At the time of step ST1-2 (second state), the control signal generating circuit 41 is configured to set the first to fourth control signals ENPb, ENNb, qb and q at "L" level and sets the fifth control signal VBS at an arbitrary voltage level (No Care).

Accordingly, at the time of step ST1-1, the voltage VB of the DQP pad 47 can exactly be measured even if the contact resistance RpB is present. The reason for this is that no electric current flows between the DQP pad 47 and the tester terminal B1 even if the contact resistance RpB is present.

Furthermore, at the time of step ST1-2, the voltage VA of the DQN pad 46 can exactly be measured even if the contact resistance RpC is present. The reason for this is that no electric current flows between the DQN pad 46 and the tester terminal C1 even if the contact resistance RpC is present between the tester terminal C1 and the DQN pad 46.

As a result, using the above equation (1), the resistance value Rterm1 of the terminating resistor can be measured as an exact value from which the influence of the contact resistances RpA, RpB and RpC is eliminated.

Furthermore, since the number of pads does not increase in the measurement method of this embodiment, unlike the comparative examples which will be described later, the increase in area of occupation can be prevented.

(2) The increase in parasitic capacitance can be prevented.

As has been described above, when the terminal end resistance is measured, there is no need to connect devices, such as transistors, to the DQP pad 47 and DQN pad 46. For example, in the case of the present embodiment, it should suffice if the tester terminals B1 and C1 are connected to the DQP pad 47 and DQN pad 46. Thus, since the number of devices, such as transistors, which are connected to the DQP pad 47 and DQN pad 46, does not increase, there is no increase in parasitic capacitance which causes a problem in high-speed operations.

Therefore, the increase in parasitic capacitance, which causes a problem in high-speed operations, can be prevented.

According to the present embodiment, the resistance value of the terminating resistor can exactly be measured by eliminating the influence of parasitic resistance of, e.g. a measuring jig, while minimizing an increase in the number of circuit elements and in parasitic capacitance.

Second Embodiment

An Example Including Variable Terminating Resistors

Next, a semiconductor integrated circuit according to a second embodiment of the present invention is described with reference to FIG. 9 and FIG. 10. This embodiment relates to an example including variable terminating resistors. In the description below, a detailed description of the parts, which are common to those in the first embodiment, is omitted.

As shown in the Figures, a differential output driver 35 including terminating resistor elements, according to the present second embodiment, differs from the driver 35 of the first embodiment in that the differential output driver 35 of the second embodiment includes variable terminating resistors RT1 and RT2 and an information holding circuit 50.

The variable terminating resistor RT1 comprises a plurality of PMOS transistors P1<1> to P1<n> and a plurality of resistor elements R1<1> to R1<n>, which are connected in series between the DQP pad 47, which is an output pad, and the power supply Vterm. A plurality of control signals ENPb<1> to ENPb<n>, which are output from the control signal generating circuit 41, are input to the gates of the plural PMOS transistors P1<1> to P1<n>.

The variable terminating resistor RT2 comprises a plurality of PMOS transistors P2<1> to P2<n> and a plurality of resistor elements R2<1> to R2<n>, which are connected in series between the DQN pad 46, which is an output pad, and the power supply Vterm. A plurality of control signals ENNb<1> to ENNb<n>, which are output from the control signal generating circuit 41, are input to the gates of the plural PMOS transistors P2<1> to P2<n>.

The information holding circuit 50 is configured to output a plurality of select signals RPG<n:1> to the control signal generating circuit 41. The select signals RPG<n:1> are signals for selectively varying the terminal end resistance values Rterm1 and Rterm2 of the variable terminating resistors RT1 and RT2.

For example, the information holding circuit 50 is a register, a blow-type fuse, etc. in a semiconductor device which can output the select signals RPG<n:1>. The select signals RPG<n:1> may be other signals which can be programmed after fabrication of a semiconductor device by means such as bonding.

Figure 10:
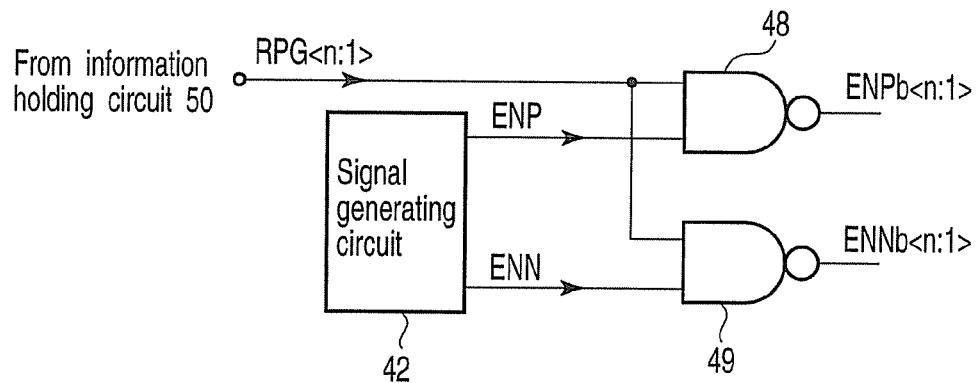
FIG. 10 is a circuit diagram showing a control signal generating circuit according to the second embodiment.

The control signal generating circuit 41 according to the present embodiment is shown, for example, in FIG. 10.

As shown in FIG. 10, the control signal generating circuit 41 comprises NAND circuits 48 and 49 and a control signal generating circuit 42.

A signal ENP is input to a first input of the NAND circuit 48, and a select signal EPG<n:1> is input to a second input of the NAND circuit 48. The NAND circuit 48 outputs a control signal ENPb<n:1>.

A select signal ENN is input to a first input of the NAND circuit 49, and a select signal EPG<n:1> is input to a second input of the NAND circuit 49. The NAND circuit 49 outputs a control signal ENNb<n:1>.

The signal generating circuit 42 is configured to generate the signals ENP and ENN. Thus, the signals ENP and ENN are not signals which are output from the information holding circuit 50, but are internal signals of the control signal generating circuit 41. In addition, the signals ENP and ENN are signals which operate with logic values opposite to those of the control signals ENPb and ENNb in the first embodiment. For example, at the time of normal operation, "H" level signals are input as both the signals ENP and ENN, and at the time of high impedance, "L" level signals are input as both the signals ENP and ENN.

As has been described above, in the structure of the present embodiment, the composite resistance Rterm1 of P1<n:1> and R1<n:1> and the composite resistance Rterm2 of P2<n:1> and R2<n:1> can be set at desired values by varying the number of PMOS transistors P1<n:1> and P2<n:1> which are turned on in the normal operation.

The method of measuring the resistance values Rterm1 and Rterm2 of the terminating resistors in the present embodiment is the same as the method in the first embodiment. Specifically, by performing the above-described measurement 1 and measurement 2 with the combination of signals RPG<n:1>, the Rterm1 and Rterm2 with the signals RPG<n:1> can be measured.

As has been described above, according to the semiconductor integrated circuit of the present embodiment, the same advantageous effects (1) and (2) as described above can be obtained.

Moreover, the present embodiment includes the variable terminating resistors RT1 and RT2 which are provided between the output pads 46 and 47 and the power supply Vterm.

Thus, by selecting the levels of the control signals ENNb<1> to ENNb<n> and ENPb<1> to ENPb<n>, the ON/OFF states of the transistors P1<1> to P1<n> and P2<1> to P2<n> can be controlled. As a result, the resistance values of the terminating resistors can advantageously be set at desired values. For example, this is advantageous in the case where the resistance values vary due to, e.g. non-uniformity in fabrication processes.

Third Embodiment

An Example of an Output Driver of a 2-Bit Width

Next, a semiconductor integrated circuit according to a third embodiment of the invention is described with reference to FIG. 11. This embodiment relates to an example in which the invention is applied to an output driver of a 2-bit width. In the description below, a detailed description of the parts common to those in the first embodiment is omitted.

<Structure Example>

To begin with, a structure example is described with reference to FIG. 11. FIG. 11 is a circuit diagram showing an output driver of a 2-bit width, which includes terminating resistor elements according to the present embodiment.

Figure 11:
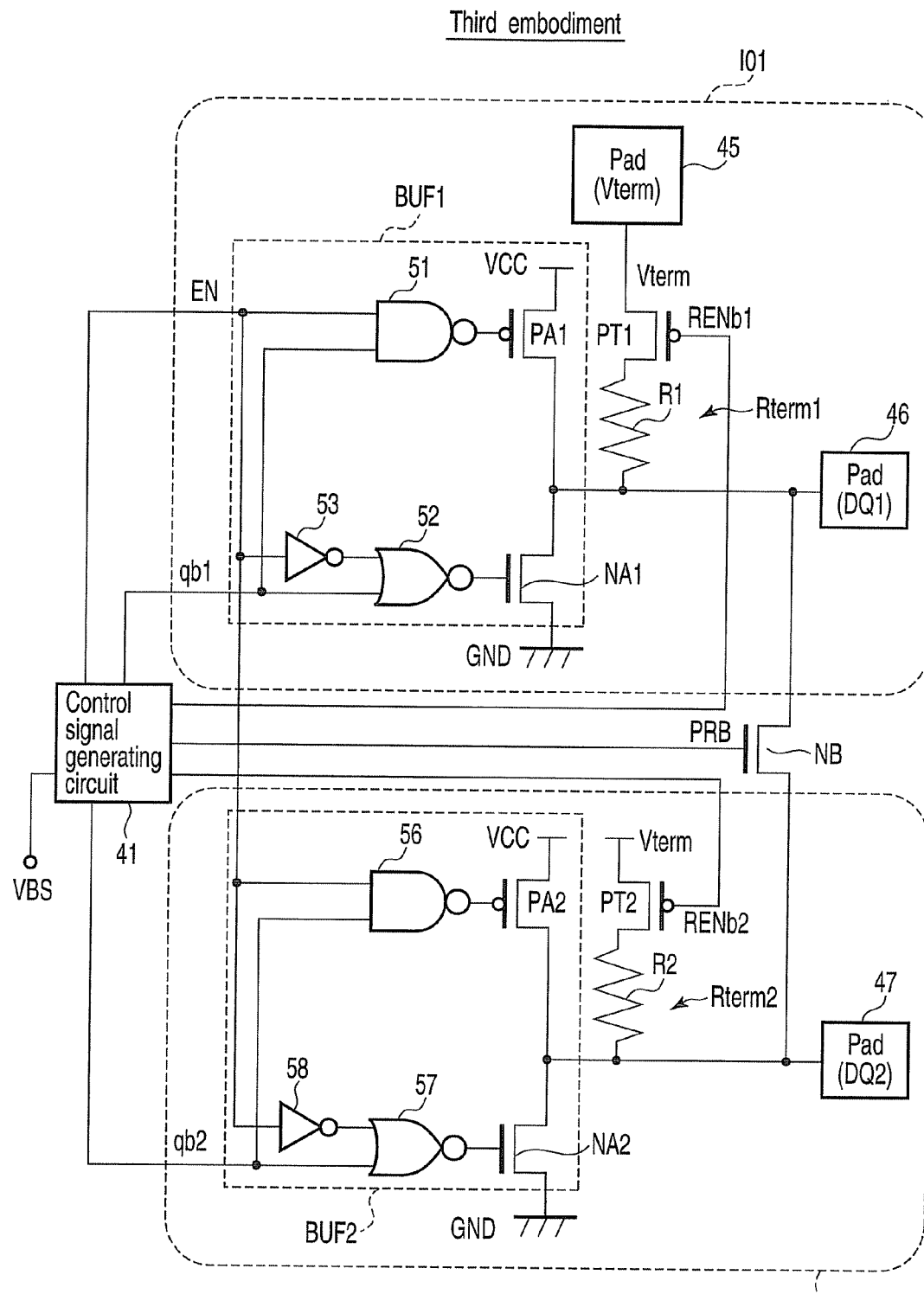
FIG. 11 is a circuit diagram showing a semiconductor integrated circuit according to a third embodiment of the invention.

As shown in FIG. 11, the output driver of this embodiment comprises first and second drivers IO1 and IO2, a transistor NB, and a control signal generating circuit 41.

The first driver IO1 includes a first resistor element R1 having one end connected to a first external output terminal 46; a first transistor PT1 which has a current path with one end connected to the other end of the first resistor element R1 and with the other end connected to an external power supply Vterm, and has a control terminal to which a first control signal RENb1 is input; and a first buffer BUF1 which has inputs to which a second control signal EN and a third control signal qb1 are input, and has an output connected to the above-mentioned one end of the first resistor element R1. The first resistor element R1 is formed of, e.g. polysilicon.

The second driver IO2 includes a second resistor element R2 having one end connected to a second external output terminal 47; a second transistor PT2 which has a current path with one end connected to the other end of the second resistor element R2 and with the other end connected to the external power supply Vterm, and has a control terminal to which a fourth control signal RENb2 is input; and a second buffer BUF2 which has inputs to which the second control signal EN and a fifth control signal qb2 are input, and has an output connected to the above-mentioned one end of the second resistor element R2. The second resistor element R2 is formed of, e.g. polysilicon.

The transistor NB (third transistor) has a current path with one end connected to the first external output terminal 46 and with the other end connected to the second external output terminal 47, and has a control terminal to which a sixth control signal PRB is input.

The voltage levels of the control signals, which are generated by the control signal generating circuit 41, are shown in FIG. 12. Specifically, at least at the time of step ST2-1 (first state) which will be described later, the control signal generating circuit 41 is configured to set the first and second control signals RENb1 and EN at "L" voltage level, sets the fourth and sixth control signals RENb2 and PRB at "H" voltage level, and sets the third and fifth control signals qb1 and qb2 at an arbitrary voltage level (No Care).

Further, at the time of step ST2-2 (second state), the control signal generating circuit 41 is configured to set the first, second and fourth control signals RENb1, EN and RENb2 at "L" voltage level, sets the sixth control signal PRB at "L" voltage level, and sets the third and fifth control signals qb1 and qb2 at an arbitrary voltage level (No Care).

Like the first embodiment, at the time of normal operation, the control signal generating circuit 41 controls the voltage levels of the control signals, as shown in FIG. 12. Further, at the time of high impedance (Hi-Z time), the control signal generating circuit 41 controls the voltage levels of the control signals, as shown in FIG. 12.

The output terminals (or input/output terminals) DQ1 and DQ2 neighbor in the output drivers 101 and 102. The output terminals DQ1 and DQ2 are connected to the outside via the pads 46 and 47. The terminal end power supply (Vterm) is also connected to the outside via the pad 45, and is commonly connected to the output drivers IO1 and IO2.

As has been described above, the control signal RENb1 is supplied to the gate of the transistor PT1, and the control signal RENb2 is supplied to the gate of the transistor PT2. Accordingly, the transistors PT1 and PT2 have such a circuit configuration that the transistors PT1 and PT2 can independently be ON/OFF controlled.

The output terminals DQ1 and DQ2 are connected via the NMOS transistor NB, and the control signal PRB is input to the gate of the transistor NB. When the sixth control signal PRB is at "H" level, the transistor NB is turned on and the output terminals DQ1 and DQ2 are electrically connected. When the sixth control signal PRB is at "L" level, the transistor NB is turned off and the output terminals DQ1 and DQ2 are electrically disconnected.

In the present embodiment, the buffers BUF1 and BUF2 are tri-state buffers. The buffers BUF1 and BUF2 are set in a high impedance state when the second control signal EN is at "L" level, and the buffers BUF1 and BUF2 output data in accordance with the third and fifth control signals qb1 and qb2 when the second control signal EN is at "H" level.

The buffer BUF1 comprises a NAND circuit 51, a NOR circuit 52, an inverter 53 and transistors PA1 and NA1.

The NAND circuit 51 has inputs to which the second control signal EN and third control signal qb1 are input, and has an output connected to the gate of the transistor PA1. The NOR circuit 52 has inputs to which an output of the inverter 53 and the third control signal qb1 are input, and has an output connected to the gate of the transistor NA1. The inverter 53 has an input to which the second control signal EN is input. The transistor PA1 has a current path with one end connected to an internal power supply Vcc, and with the other end connected to one end of a current path of the transistor NA1. The other end of the current path of the transistor NA1 is connected to a ground power supply GND.

The buffer BUF2 comprises a NAND circuit 56, a NOR circuit 57, an inverter 58 and transistors PA2 and NA2.

The NAND circuit 56 has inputs to which the second control signal EN and fifth control signal qb2 are input, and has an output connected to the gate of the transistor PA2. The NOR circuit 57 has inputs to which an output of the inverter 58 and the fifth control signal qb2 are input, and has an output connected to the gate of the transistor NA2. The inverter 58 has an input to which the second control signal EN is input.

The transistor PA2 has a current path with one end connected to the internal power supply Vcc, and with the other end connected to one end of a current path of the transistor NA2. The other end of the current path of the transistor NA2 is connected to the ground power supply GND.

Since the transistor NB does not require a large current driving power (i.e. the ON resistance at a turn-on time may be relatively high), a transistor with a very small size is usable therefor. Thus, the increase in capacitance of the output terminal DQ1, DQ2 due to the transistor NB is substantially negligible.

<Measurement Method of Resistance Values of Terminating Resistors>

Figure 13:
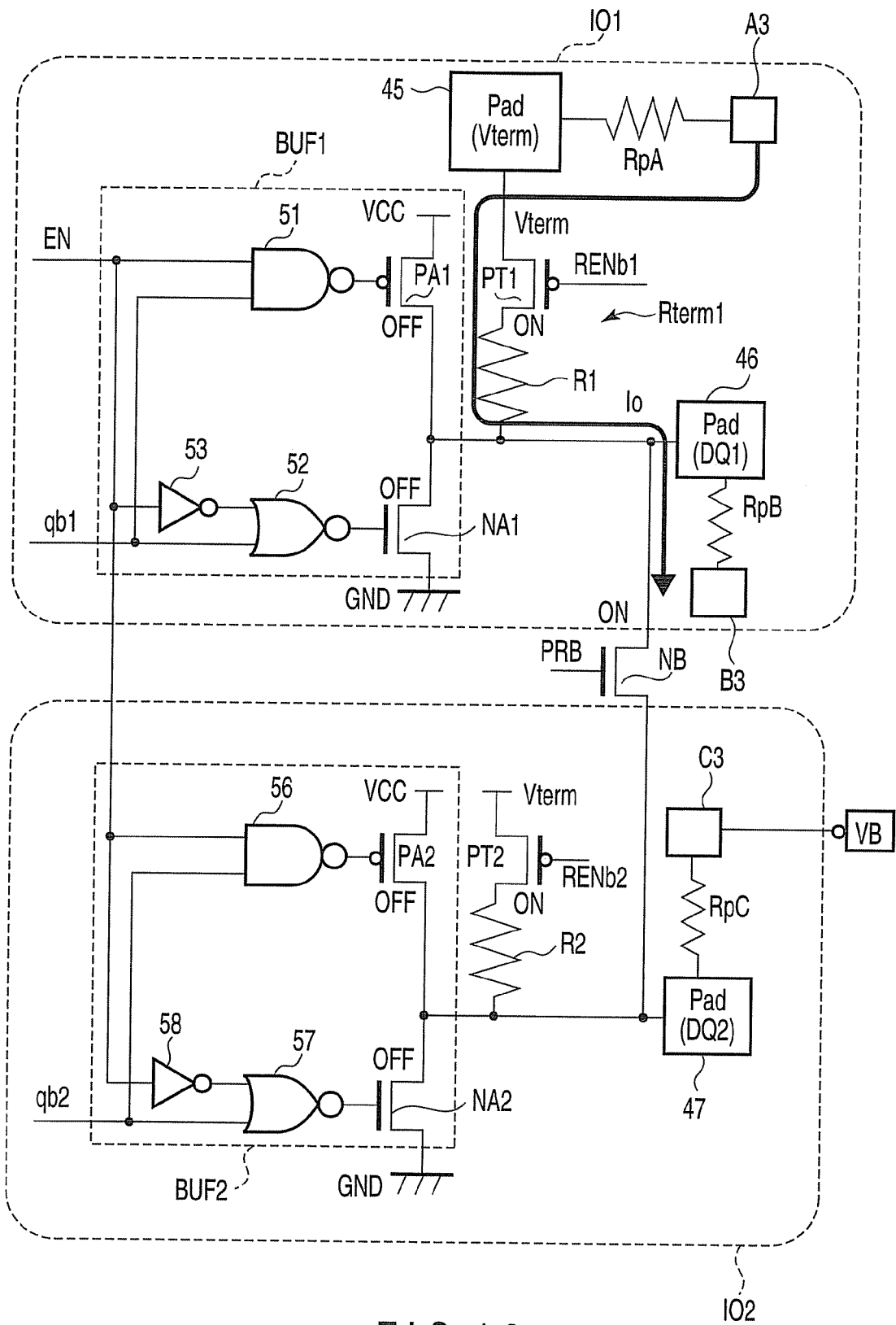
FIG. 13 is a circuit diagram for explaining a step of the measurement method of the semiconductor integrated circuit according to the third embodiment.
Figure 14:
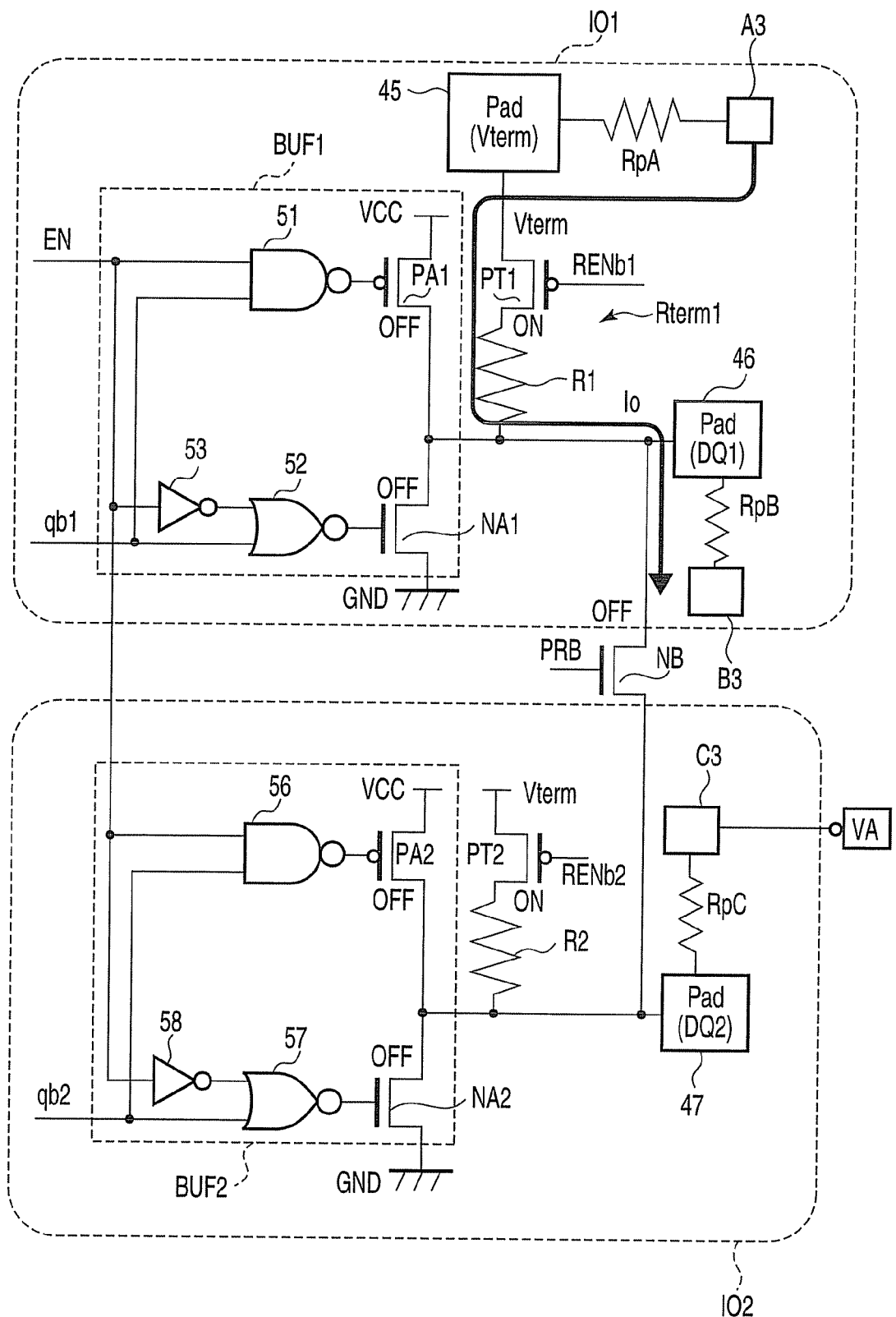
FIG. 14 is a circuit diagram for explaining a step of the measurement method of the semiconductor integrated circuit according to the third embodiment.

Next, referring to FIG. 12 to FIG. 14, a description is given of a measurement method of resistance values of the terminating resistors Rterm1 and Rterm2 of the semiconductor integrated circuit according to the present embodiment. In the description below, a case of measuring the first terminating resistor Rterm1, which is the series resistor of the transistor PT1 and first resistor element R1, is described by way of example.

The resistance value of the terminating resistor Rterm1 can exactly be measured by performing measurement twice, that is, step ST2-1 (measurement 1) and step ST2-2 (measurement 2), which will be described below. In step ST2-1 (measurement 1), a voltage VB is measured. Subsequently, in step ST2-2 (measurement 2), a voltage VA is measured. In this description, depiction of wiring of the control signal generating circuit 41 is omitted.

<Step ST2-1 (Measurement 1)>

To begin with, referring to FIG. 13, measurement 1 is described. Step ST2-1 (measurement 1) is a step of measuring the voltage VB.

As shown in FIG. 13, the control signal generating circuit 41 sets the control signals EN and RENb1 at "L" voltage level and the control signals RENb2 and PRB at "H" level, thereby to turn on the transistors PT1 and NB and to turn off the transistor PT2 and the buffers BUF1 and BUF2.

A tester terminal A3 is connected to the power supply Vterm pad 45, a tester terminal B3 is connected to the DQ1 pad 46, and a tester terminal C3 is connected to the DQ2 pad 47. Then, a current Io is caused to flow between the tester terminal A3 and the tester terminal B3.

At this time, since the transistor PT2 and buffers BUF1 and BUF2 are in the OFF state, an electric current flows only through a current path shown in FIG. 13, and the current Io flows through the transistor PT1 and the resistor element R1. In this state, the potential of the DQ2 is measured by the tester terminal C3. This voltage is assumed to be VB. A contact resistance RpC and the ON resistance of the transistor NB are present between the tester terminal C3 and the node DQ2. However, since no current flows between the node DQ2 and tester terminal C3, the potential of the node DQ2 can exactly be measured.

<Step ST2-2 (Measurement 2)>

Next, referring to FIG. 14, measurement 2 is described.

As shown in FIG. 14, the control signal generating circuit 41 sets all the control signals EN, RENb1, RENb2 and PRB at "L" voltage level, thereby to turn on the transistors PT1 and PT2 and to turn off the transistor NB and the buffers BUF1 and BUF2.

At this time, a current Io (the same as the current that is caused to flow in measurement 1) is caused to flow between the tester terminal A3 and the tester terminal B3. In this case, it is necessary to perform measurement 2 while keeping the contact state in measurement 1, so that the contact resistance RpA between the power supply Vterm pad 45 and the tester terminal A3 is equal between the measurement 1 and measurement 2.

In this case, since the buffers BUF1 and BUF2 are in the OFF state, an electric current flows only through a current path shown in FIG. 14, and the current Io flows through the transistor PT1 and resistor element R1. In this state, the potential of the node DQ2 is measured by the tester terminal C3. The voltage in this state is assumed to be VA.

Although a contact resistance RpC is present between the tester terminal C3 and the node DQ2, no current flows between the node DQ2 and the tester terminal C3. Therefore, the potential of the node DQ2 can exactly be measured. Needless to say, since no electric current flows between the power supply Vterm and the node DQ2, the potential of the node DQ2 in this state is equal to the potential of the power supply Vterm.

By the measurement 2, it is thus possible to exactly measure the voltage at the terminal end when the current Io flows through the transistor PT1 and resistor element R1.

<Calculation of Resistance Value Rterm1 of Terminating Resistors>

The resistance value Rterm1 of the terminating resistor (the series resistor of the transistor PT1 and first resistor element R1) can be calculated by using the voltages VA and VB which are obtained by measurement 1 and measurement 2 in steps ST2-1 and ST2-2, and the current Io that is caused to flow.

Specifically, the resistance value Rterm1 of the terminating resistor is expressed by the following equation (1):

$$Rterm1 = (VA - VB)/Io \quad (1)$$

As has been described in connection with the steps ST2-1 and ST2-2, the measured voltages VA and VB are exact values from which the influence of the contact resistances RpA, RpB and RpC is eliminated.

In this description, the output driver with the 2-bit width has been described. However, the invention is limited to the output driver, and is similarly applicable, for example, to a case in which a receiver circuit is connected to the DQ1 pad 46 and DQ2 pad 47, as will be described in connection with a fifth embodiment of the invention, and the same advantageous effects can be obtained. Moreover, the invention is similarly applicable to the input pins and input/output pins to which both the output driver and input receiver are connected. Besides, the invention is similarly applicable if the bit width of the output pin of the semiconductor device (or the input pin or the input/output pin) is 2 bits or more.

<Advantageous Effects of the Third Embodiment>

According to the semiconductor integrated circuit of the present third embodiment, at least the same advantageous effects (1) and (2) as described above can be obtained. The invention is applicable to the 2-bit width output driver, where necessary, as in the present embodiment.

Fourth Embodiment

An Example Including a Plurality of Transistors

Next, a semiconductor integrated circuit according to a fourth embodiment of the present invention is described with reference to FIG. 15. This embodiment relates to an example in which a plurality of transistors are provided between output nodes DQ1 and DQ2. A detailed description of the parts, which are common to those in the third embodiment, is omitted.

Figure 15:
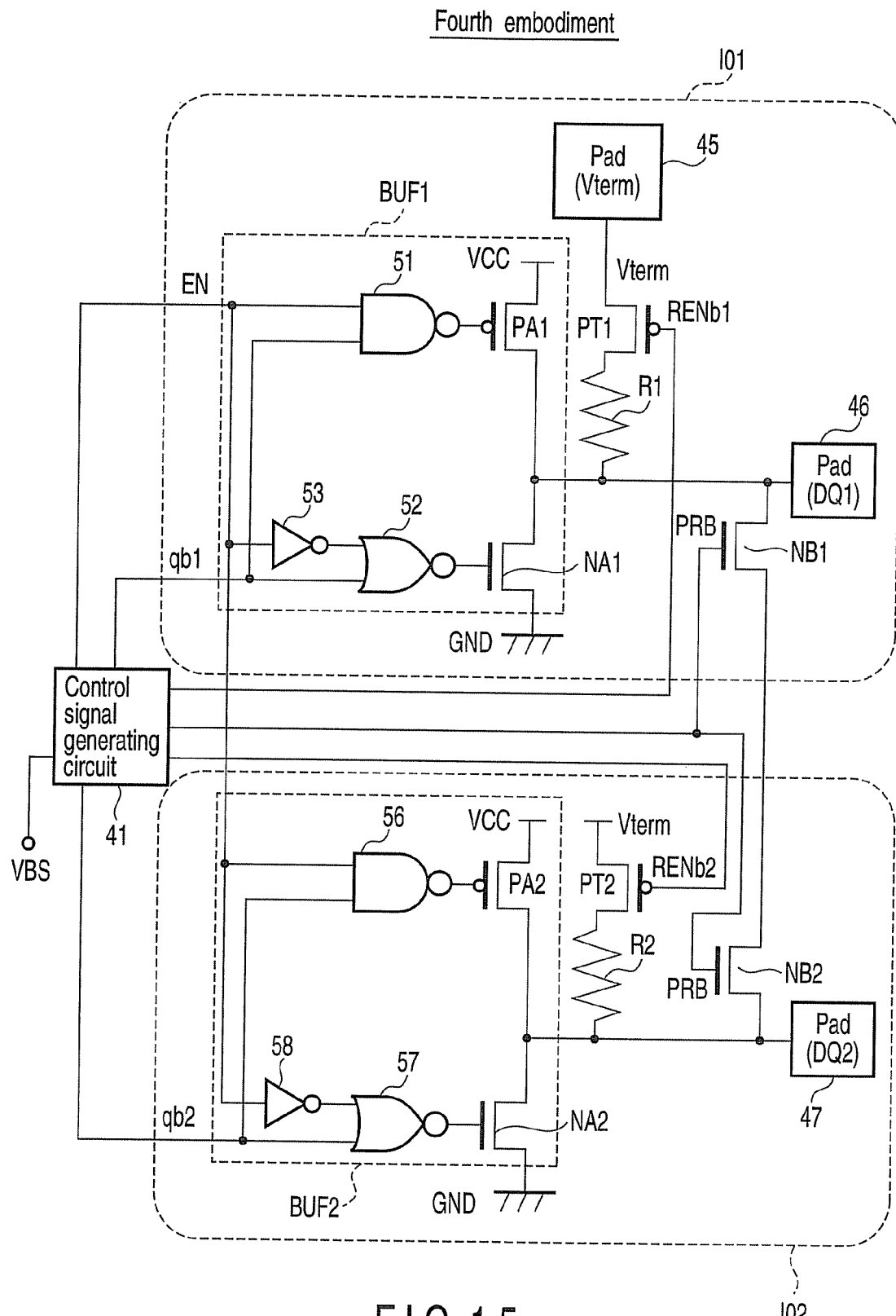
FIG. 15 is a circuit diagram showing a semiconductor integrated circuit according to a fourth embodiment of the invention.

As shown in FIG. 15, the semiconductor integrated circuit according to the present embodiment differs from that according to the third embodiment in that transistors NB1 and NB2 are connected in series in two stages between the nodes DQ1 and DQ2. Specifically, the fourth embodiment differs from the third embodiment in that the semiconductor integrated circuit of the fourth embodiment further includes the transistor NB2 which has a current path with one end connected to the other end of the current path of the transistor NB1, and with the other end connected to the output node DQ2, and has a control terminal to which the sixth control signal PRB is input. Accordingly, the sixth control signal PRB is input to both the gates of the transistors NB1 and NB2.

The measurement method of the resistance value of the terminating resistor is the same as that in the third embodiment.

According to the semiconductor integrated circuit of this embodiment, at least the same advantageous effects (1) and (2) as described above can be obtained.

Further, in the circuit configuration of this embodiment, the transistors NB1 and NB2 are connected in series in two stages between the nodes DQ1 and DQ2.

Thus, even in the case where the DQ1 pad 46 and DQ2 pad 47 are not disposed close to each other in the semiconductor device, an increase in parasitic capacitance due to an increase in wiring capacitance can be prevented, and signal delay can advantageously be prevented. The reason for this is that in the above-described case, the wiring length between the pad 46, 47 and the transistor NB increases and, in some case, the parasitic capacitance due to wiring capacitance increases.

The number of stages of transistors NB (third transistors), which are connected between the nodes DQ1 and DQ2, is not limited to two, as in the present embodiment, and the transistors NB may be provided in a greater number of stages. The transistors NB are not limited to NMOS transistors, and the invention is similarly applicable even in the case where the transistors NB are PMOS transistors, for instance. Besides, the invention is similarly applicable even in a case where the transistors NB comprise a PMOS transistor and an NMOS transistor which are connected in parallel.

Fifth Embodiment

An Example of a Receiver of a 2-Bit Width

Next, a semiconductor integrated circuit according to a fifth embodiment of the present invention is described with reference to FIG. 16 to FIG. 20. This embodiment relates to an example in which the invention is applied to a receiver of a 2-bit width. In the description below, a detailed description of the parts common to those in the third embodiment is omitted.

<Structure Example>

Figure 16:
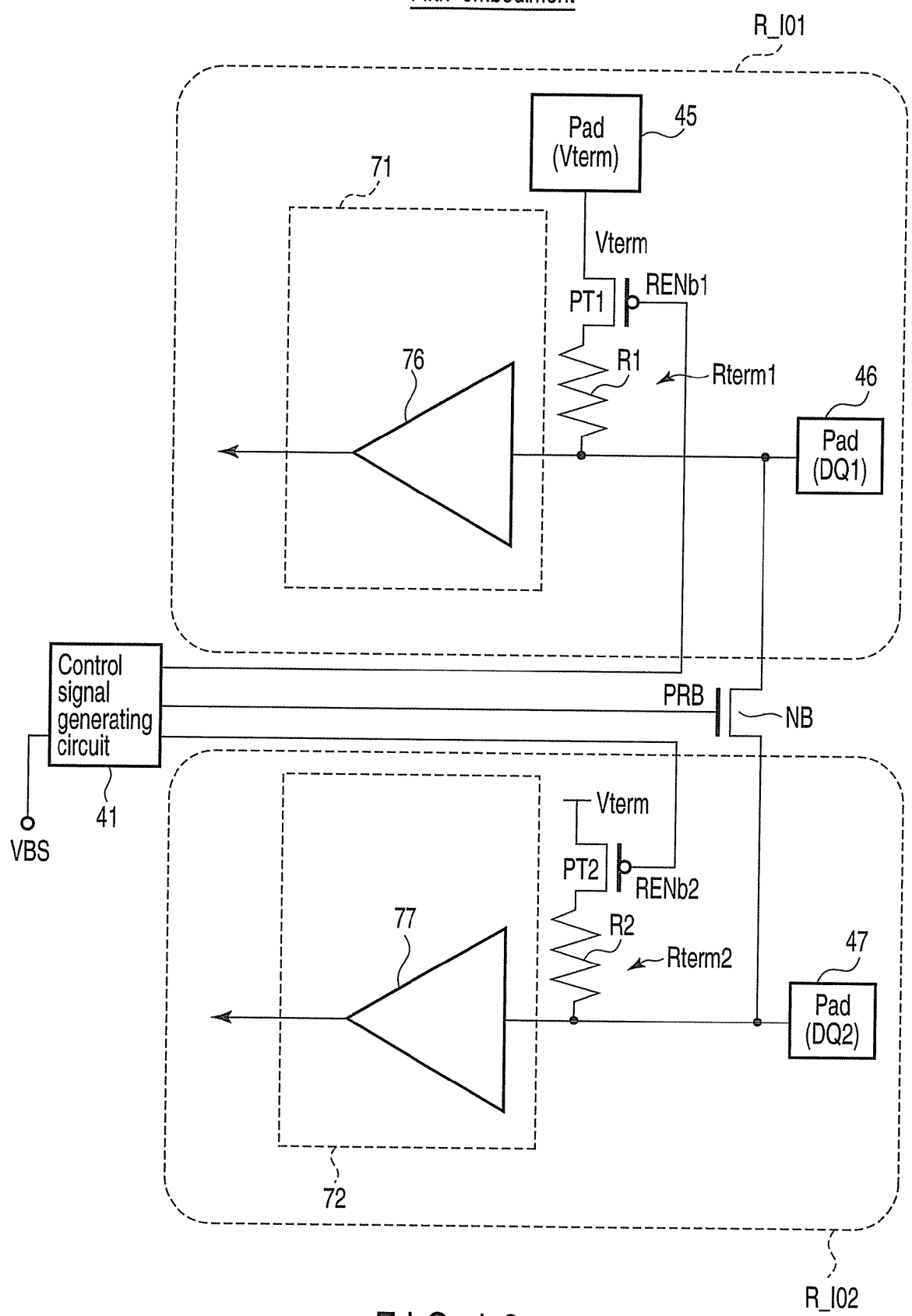
FIG. 16 is a circuit diagram showing a semiconductor integrated circuit according to a fifth embodiment of the invention.

To begin with, a structure example is described with reference to FIG. 16. FIG. 16 is a circuit diagram showing a receiver of a 2-bit width, which includes terminating resistor elements according to the present embodiment.

As shown in FIG. 16, the fifth embodiment differs from the third embodiment in that the receiver of this embodiment comprises first and second receivers R_IO1 and R_IO2.

The first receiver R_IO1 includes a first resistor element R1 having one end connected to a first external input terminal 46; a first transistor PT1 which has a current path with one end connected to the other end of the first resistor element R1 and with the other end connected to an external power supply Vterm, and has a control terminal to which a first control signal RENb1 is input; and a first input receiver circuit 71 which has an input connected to the first external input terminal 46.

The second receiver R_IO2 includes a second resistor element R2 having one end connected to a second external input terminal 47; a second transistor PT2 which has a current path with one end connected to the other end of the second resistor element R2 and with the other end connected to the external power supply Vterm, and has a control terminal to which a second control signal RENb2 is input; and a second input receiver circuit 72 which has an input connected to the second external input terminal 47.

The first input receiver circuit 71 is composed of an input buffer 76.

The second input receiver circuit 72 is composed of an input buffer 77.

The voltage levels of the control signals, which are generated by the control signal generating circuit 41, are shown in FIG. 17. Specifically, at least at the time of step ST3-1 (first state) which will be described later, the control signal generating circuit 41 sets the second and third RENb2 and PRB at "H" voltage level, and sets the first control signal RENb1 at "L" voltage level.

Further, at the time of step ST3-2 (second state), the control signal generating circuit 41 sets the first, second and third control signals RENb1, RENb2 and PRB at "L" voltage level.

Like the first embodiment, at the time of normal operation, the control signal generating circuit 41 controls the voltage levels of the control signals, as shown in FIG. 17. Further, at the time of high impedance (Hi-Z time), the control signal generating circuit 41 controls the voltage levels of the control signals, as shown in FIG. 17.

The external terminals (or external input/output terminals) DQ1 and DQ2 neighbor in the receivers R_IO1 and R_IO2. The output terminals DQ1 and DQ2 are connected to the outside via the pads 46 and 47. The terminal end power supply (Vterm) is also connected to the outside via the pad 45, and is commonly connected to the receivers R_IO1 and R_IO2.

<Measurement Method of Resistance Values of Terminating Resistors>

Figure 18:
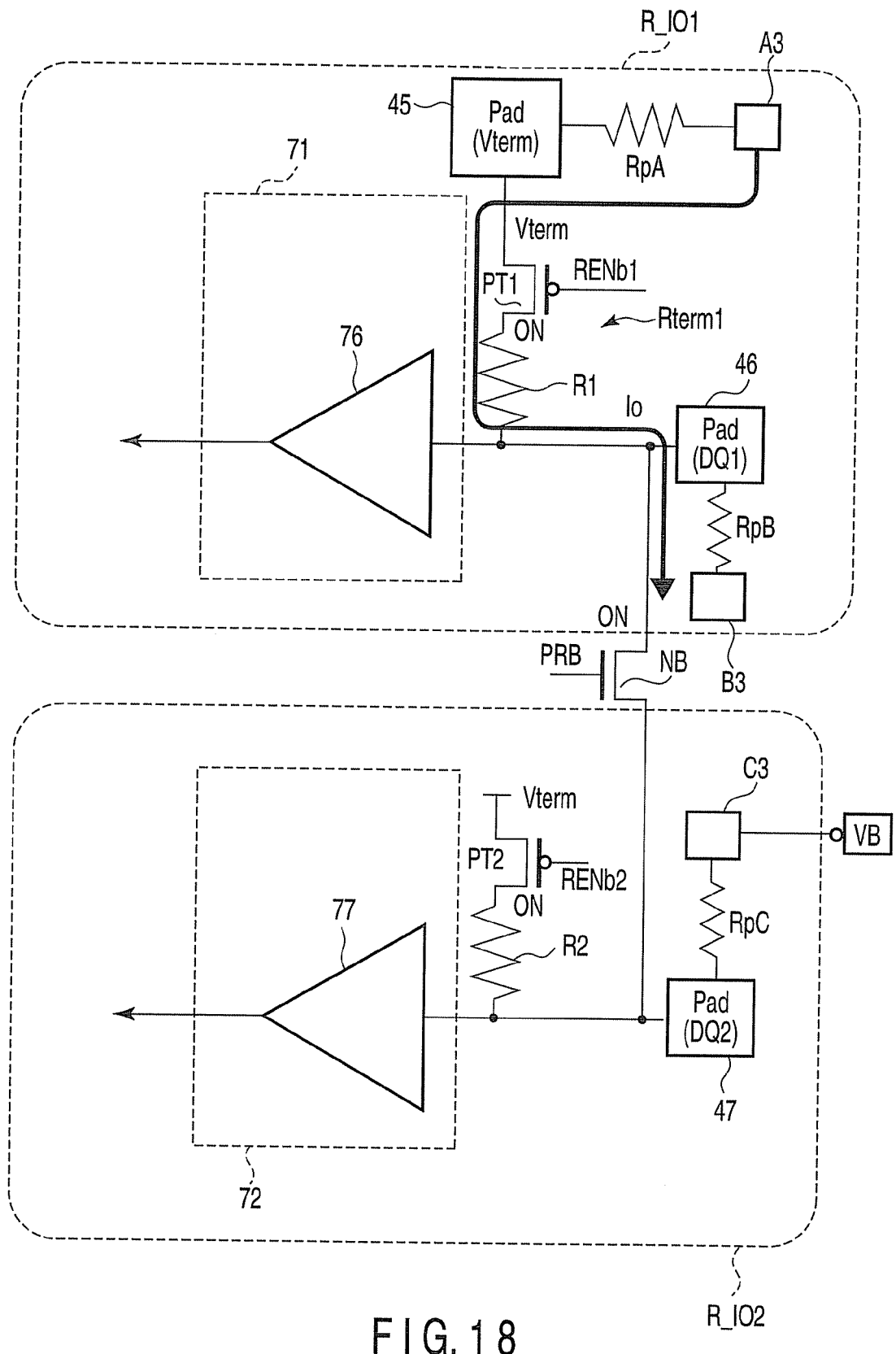
FIG. 18 is a circuit diagram for explaining a step of the measurement method of the semiconductor integrated circuit according to the fifth embodiment.
Figure 19:
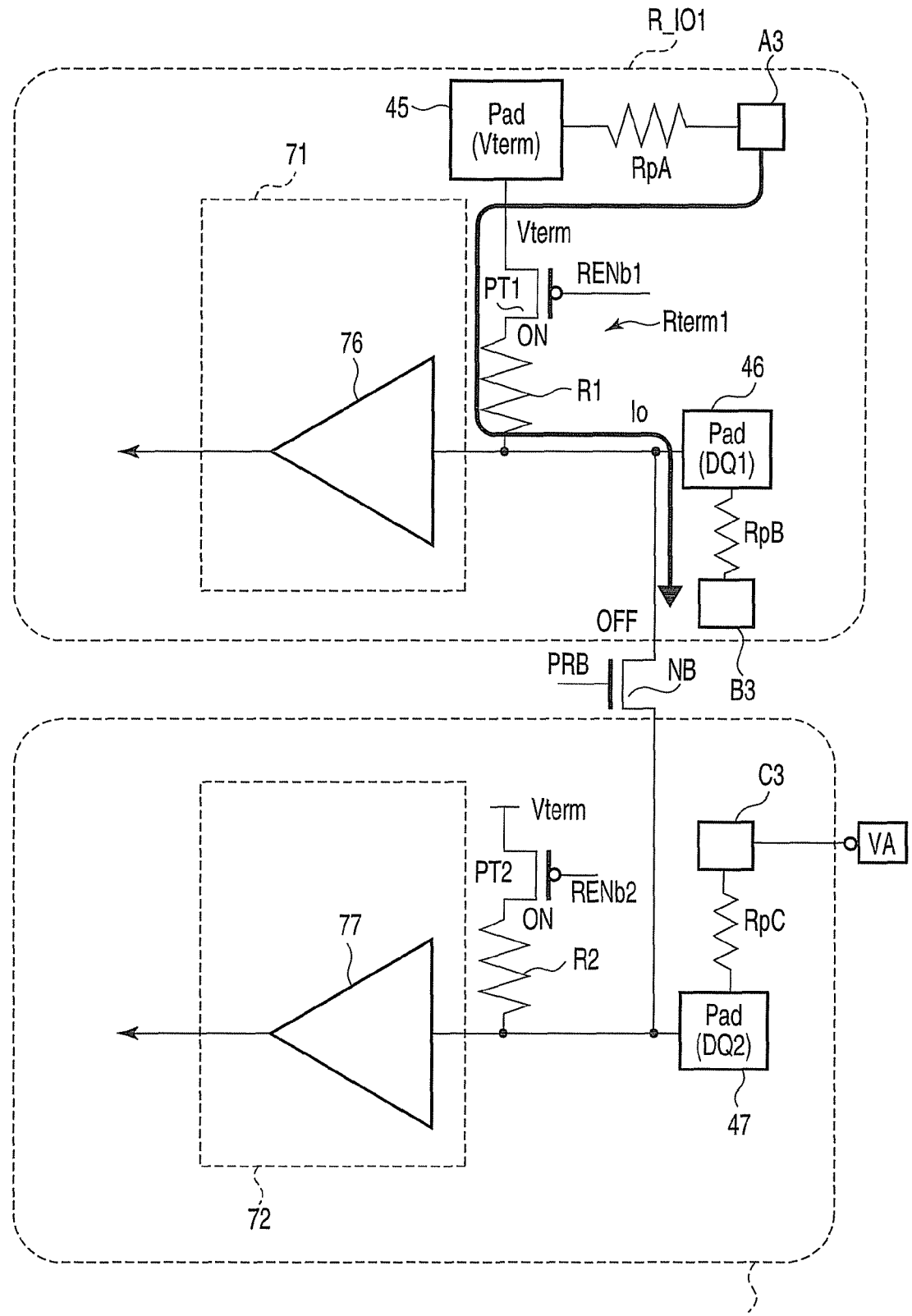
FIG. 19 is a circuit diagram for explaining a step of the measurement method of the semiconductor integrated circuit according to the fifth embodiment.

Next, referring to FIG. 17 to FIG. 19, a description is given of a measurement method of resistance values of the terminating resistors Rterm1 and Rterm2 of the semiconductor integrated circuit according to the present embodiment. In the description below, a case of measuring the first terminating resistor Rterm1, which is the series resistor of the transistor PT1 and first resistor element R1, is described by way of example.

The resistance value of the terminating resistor Rterm1 can exactly be measured by performing measurement twice, that is, step ST3-1 (measurement 1) and step ST3-2 (measurement 2), which will be described below. In step ST3-1 (measurement 1), a voltage VB is measured. Subsequently, in step ST3-2 (measurement 2), a voltage VA is measured. In this description, depiction of wiring of the control signal generating circuit 41 is omitted.

<Step ST3-1 (Measurement 1)>

To begin with, referring to FIG. 18, measurement 1 is described. Step ST3-1 (measurement 1) is a step of measuring the voltage VB.

As shown in FIG. 18, the control signal generating circuit 41 sets the control signals RENb1 at "L" voltage level and the control signals RENb2 and PRB at "H" level, thereby to turn on the transistors PT1 and NB and to turn off the transistor PT2.

A tester terminal A3 is connected to the power supply Vterm pad 45, a tester terminal B3 is connected to the DQ1 pad 46, and a tester terminal C3 is connected to the DQ2 pad 47. Then, a current Io is caused to flow between the tester terminal A3 and the tester terminal B3.

At this time, since the transistor PT2 is in the OFF state, an electric current flows only through a current path shown in FIG. 18, and the current Io flows through the transistor PT1 and the resistor element R1. In this state, the potential of the DQ2 is measured by the tester terminal C3. This voltage is assumed to be VB. A contact resistance RpC and the ON resistance of the transistor NB are present between the tester terminal C3 and the node DQ2. However, since no current flows between the node DQ2 and tester terminal C3, the potential of the node DQ2 can exactly be measured.

<Step ST3-2 (Measurement 2)>

Next, referring to FIG. 19, measurement 2 is described.

As shown in FIG. 19, the control signal generating circuit 41 sets all the control signals RENb1, RENb2 and PRB at "L" voltage level, thereby to turn on the transistors PT1 and PT2 and to turn off the transistor NB.

At this time, a current Io (the same as the current that is caused to flow in measurement 1) is caused to flow between the tester terminal A3 and the tester terminal B3. In this case, it is necessary to perform measurement 2 while keeping the contact state in measurement 1, so that the contact resistance RpA between the power supply Vterm pad 45 and the tester terminal A3 is equal between the measurement 1 and measurement 2.

In this case, since the transistor NB is in the OFF state, an electric current flows only through a current path shown in FIG. 19, and the current Io flows through the transistor PT1 and resistor element R1. In this state, the potential of the node DQ2 is measured by the tester terminal C3. The voltage in this state is assumed to be VA.

Although a contact resistance RpC is present between the tester terminal C3 and the node DQ2, no current flows between the node DQ2 and the tester terminal C3. Therefore, the potential of the node DQ2 can exactly be measured. Needless to say, since no electric current flows between the power supply Vterm and the node DQ2, the potential of the node DQ2 in this state is equal to the potential of the power supply Vterm.

By the measurement 2, it is thus possible to exactly measure the voltage at the terminal end when the current Io flows through the transistor PT1 and resistor element R1.

<Calculation of Resistance Value Rterm1 of Terminating Resistor>

The resistance value Rterm1 of the terminating resistor (the series resistor of the transistor PT1 and first resistor element R1) can be calculated by using the voltages VA and VB which are obtained by measurement 1 and measurement 2 in steps ST3-1 and ST3-2, and the current Io that is caused to flow.

Specifically, the resistance value Rterm1 of the terminating resistor is expressed by the following equation (1):

$$Rterm1 = (VA - VB)/Io \qquad (1)$$

As has been described in connection with the steps ST3-1 and ST3-2, the measured voltages VA and VB are exact values from which the influence of the contact resistances RpA, RpB and RpC is eliminated.

<Advantageous Effects of the Fifth Embodiment>

According to the semiconductor integrated circuit of the present fifth embodiment, at least the same advantageous effects (1) and (2) as described above can be obtained. Further, the invention is applicable to the 2-bit width receiver, where necessary, as in the present embodiment.

Comparative Example 1

An Example of an Output Driver 350

Next, a semiconductor integrated circuit according to comparative example 1 is described with reference to FIG. 20, in order to compare this semiconductor integrated circuit with the semiconductor integrated circuits according to the above-descried first to fourth embodiments. A detailed description of the parts common to those in the first embodiment is omitted.

With reference to the comparative example 1, a description is given of the measurement method of the resistance value of a terminating resistor in a differential output driver 350 including terminating resistors.

Figure 20:
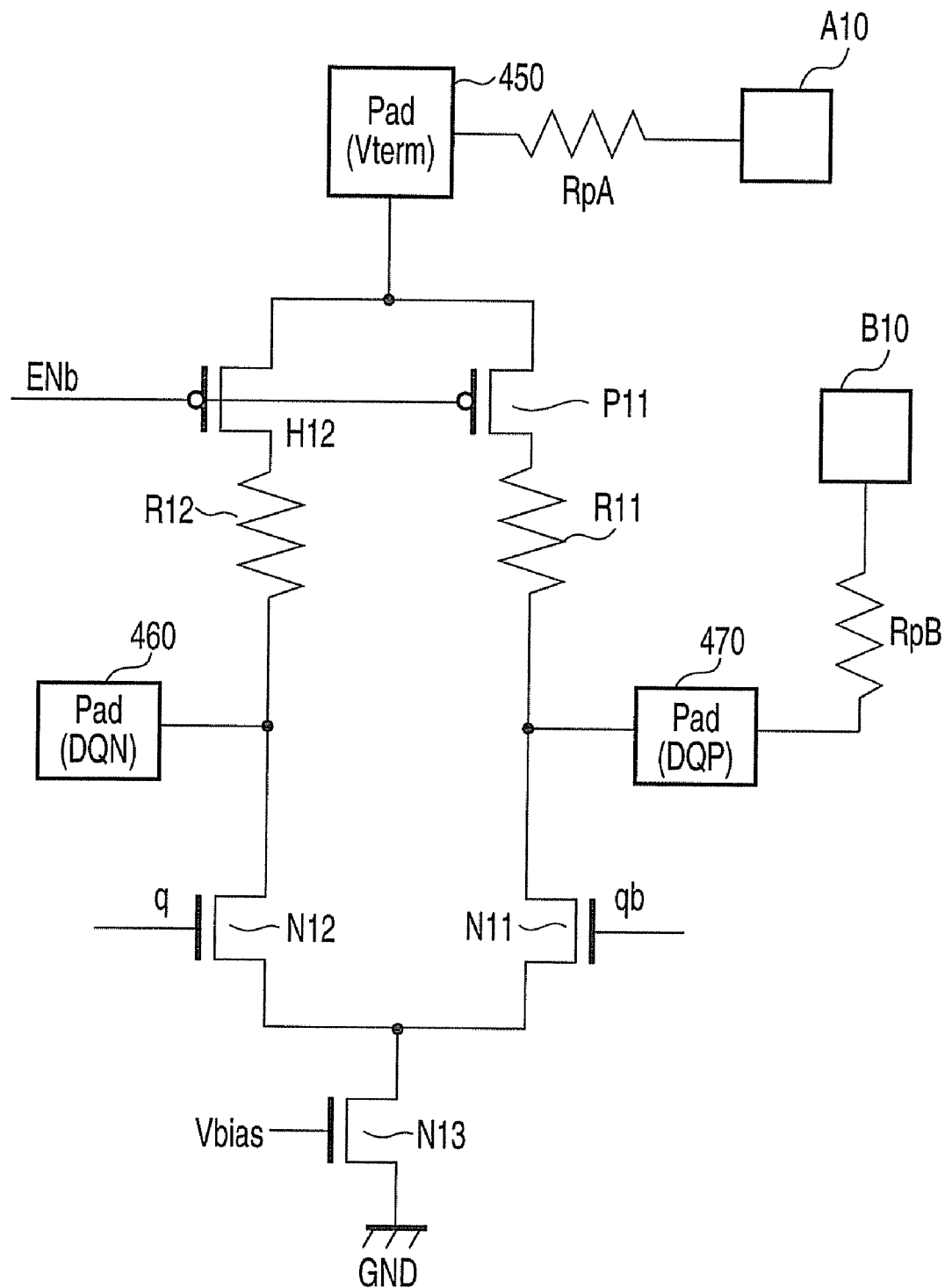
FIG. 20 is a circuit diagram showing a semiconductor integrated circuit according to comparative example 1.

As regards the differential output driver 350 shown in FIG. 20, a case of measuring the terminal end resistance value (=Rterm) on the DQP side is described by way of example. The terminal end resistance value, which is to be measured, is a series resistance of a P-type MOS transistor P11 which is used for switching, and a resistor element R11.

At the time of measurement, terminals A10 and B10 of a tester are connected to a pad (Vterm) 450 and a pad (DQP) 470 and a voltage is applied to these pads, thereby to turn on the transistor P11 and to turn off a transistor N11, and to cause a current to flow between the pad (Vterm) 450 and the pad (DQP) 470.

If it is assumed that the potential difference between the terminal A10 and terminal B10 is Vo and the current flowing between the terminal A10 and terminal B10 is Io, the resistance between the terminal A10 and terminal B10 is given by Ro=Vo/Io. If the value of the contact resistance (RpA and RpB) between the jig of the tester and the pad is sufficiently small, relative to the terminal end resistance value Rterm, the terminal end resistance value is Rterm≈Ro, and the terminal end resistance value Rterm can exactly be obtained.

However, when the above-described structure and the measurement method are used, the measured terminal end resistance value Rterm necessarily becomes a value including an additional value of the contact resistance (RpA and RpB) between the jig of the tester and the pad. When the semiconductor device, which is sealed in the package, is mounted on the board (PCB), the respective terminals of the semiconductor device and the PCB are connected by soldering with a very low resistance value. Thus, after the mounting, the contact resistance becomes a negligible value. However, at the time of the test, the contact value of about several Ω is present (in particular, at the time of the wafer test, stable contact at low resistance is difficult).

This contact resistance (RpA and RpB) of about several Ω is not negligible, relative to the terminal resistance value Rterm of several-ten Ω, which is to be measured. Besides, the resistance value of this contact resistance (RpA and RpB) varies from time to time in measurement, depending on various conditions such as contamination of the jig, the number of times of measurement, and the contact pressure between the terminal of the semiconductor device and the jig. It is thus impossible to eliminate such a variation as a fixed offset from the measured resistance value.

As has been described above, in the structure of comparative example 1, it is not possible to exactly measure the resistance value Rterm of the terminating resistor, with the influence of contact resistances RpA and RpB being eliminated.

Comparative Example 2

An Example of an Output Driver 350

Next, a semiconductor integrated circuit according to comparative example 2 is described with reference to FIG. 21, in order to compare this semiconductor integrated circuit with the semiconductor integrated circuits according to the above-descried first to fourth embodiments. A detailed description of the parts common to those in the first embodiment is omitted.

As shown in FIG. 21, if a pad (PrbV) 480 and a pad (PrbP) 490 for voltage measurement are added to the terminal end power supply Vterm and the node DQP, the terminal end resistance value Rterm can be measured, with the influence of contact resistance being eliminated.

In this circuit configuration, an electric current is caused to flow from the tester terminal A11 to the tester terminal B11, and the voltage is measured by tester terminals C11 and D11. Thereby, a so-called 4-terminal measurement method is enabled. Specifically, the exact terminal end resistance value Rterm (=V1/Io) is measured by measuring the current Io flowing between the tester terminal A11 and tester terminal B11 and the potential difference V1 between the tester terminal C11 and tester terminal D11. Therefore, the resistance value of the terminal end resistance value Rterm can desirably be measured without the influence of the contact resistance (RpA, RpB, RpC, RpD).

In the circuit configuration of comparative example 2, however, it is necessary to additionally provide the pads 480 and 490 for voltage measurement. Consequently, the pin capacitance of the output terminals increases, and the device area increases due to the addition of the pads. Since such a disadvantage occurs as an adverse effect, this technique is not practical.

In the above-described comparative examples 1 and 2, the resistance value of the terminating resistor, which is added to the input/output terminal of the semiconductor device, cannot exactly be measured by eliminating the contact resistance, without an increase in device area and pin capacitance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a first transistor of a first conductivity type, which has a current path with one end connected to a first power supply, and has a control terminal to which a first control signal is input;
   a second transistor of the first conductivity type, which has a current path with one end connected to the first power supply, and has a control terminal to which a second control signal is input;
   a first resistor element having one end connected to the other end of the current path of the first transistor, and having the other end connected to a first output terminal;
   a second resistor element having one end connected to the other end of the current path of the second transistor, and having the other end connected to a second output terminal;
   a third transistor of a second conductivity type, which has a current path with one end connected to the other end of the first resistor terminal, and has a control terminal to which a third control signal is input;
   a fourth transistor of the second conductivity type, which has a current path with one end connected to the other end of the second resistor terminal, and has a control terminal to which a fourth control signal is input;
   a fifth transistor of the second conductivity type, which has a current path with one end connected to the other end of the current path of the third transistor and to the other end of the current path of the fourth transistor, and with the other end connected to a second power supply, and has a control terminal to which a fifth control signal is input;
   a control signal generating circuit which sets, at least at a time of a first state, the first and fifth control signals at a first voltage level, and the second, third and fourth control signals at a second voltage level, and sets, at a time of a second state, the first to fourth control signals at the first voltage level, and the fifth control signal at an arbitrary voltage level;
   a first variable terminating resistor including a plurality of transistors each having a current path with one end connected to the first power supply and having a control terminal to which the first control signal is input, and a plurality of resistor elements each having one end connected to the other end of the current path of the associated one of the plurality of the transistors and having the other end connected to the first output terminal; and
   a second variable terminating resistor including a plurality of transistors each having a current path with one end connected to the first power supply and having a control terminal to which the second control signal is input, and a plurality of resistor elements each having one end connected to the other end of the current path of the associated one of the plurality of the transistors and having the other end connected to the second output terminal.

2. The circuit according to claim 1, wherein the control signal generating circuit comprises:
   a first NAND circuit having a first input to which a first select signal is input, and having a second input to which a second select signal is input;
   a second NAND circuit having a first input to which a third select signal is input, and having a second input to which the second select signal is input; and
   a signal generating circuit which generates the first and third select signals.

3. The circuit according to claim 1, further comprising:
   a first pad which is connected to said one end of the current path of the first transistor and to said one end of the current path of the second transistor;
   a second pad which is connected to a first output pin via the current path of the third transistor; and
   a third pad which is connected to a second output pin via the current path of the fourth transistor.

4. The circuit according to claim 1, further comprising:
   a bias circuit which outputs a bias signal to the control terminal of the fifth transistor and the control signal generating circuit.

5. The circuit according to claim 1, further comprising:
   a receiver which functions, together with the semiconductor integrated circuit, as an input/output circuit.

6. The circuit according to claim 1, further comprising:
   a controller which controls the semiconductor integrated circuit.

7. The circuit according to claim 6, further comprising:
   a graphic core which includes a plurality of micro-lenses which are arranged in a matrix, and is controlled by the controller; and
   a CMOS I/O which receives a graphic signal from the graphic core.

* * * * *